(12) United States Patent
Koshihara

(10) Patent No.: US 11,747,637 B2
(45) Date of Patent: *Sep. 5, 2023

(54) DISPLAY DEVICE

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 345 days.

This patent is subject to a terminal disclaimer.

(21) Appl. No.: 17/184,974

(22) Filed: Feb. 25, 2021

(65) Prior Publication Data

US 2021/0181520 A1 Jun. 17, 2021

Related U.S. Application Data

(63) Continuation of application No. 16/364,671, filed on Mar. 26, 2019, now Pat. No. 10,976,563.

(30) Foreign Application Priority Data

Mar. 27, 2018 (JP) .................... 2018-059468

(51) Int. Cl.
*G02B 27/14* (2006.01)
*G03B 33/12* (2006.01)
(Continued)

(52) U.S. Cl.
CPC ......... *G02B 27/14* (2013.01); *G02B 27/0172* (2013.01); *G03B 33/12* (2013.01); *H10K 50/841* (2023.02); *H10K 50/865* (2023.02); *H10K 59/126* (2023.02); *H10K 59/131* (2023.02); *H10K 59/38* (2023.02); *G02B 6/003* (2013.01);
(Continued)

(58) Field of Classification Search
None
See application file for complete search history.

(56) References Cited

U.S. PATENT DOCUMENTS 5,371,617 A 12/1994 Mitsutake et al.
5,673,127 A 9/1997 Takahara et al.
(Continued)

FOREIGN PATENT DOCUMENTS

JP H05-181213 A 7/1993
JP H11-067448 A 3/1999
(Continued)

*Primary Examiner* — Darryl J Collins
*Assistant Examiner* — Tamara Y. Washington
(74) *Attorney, Agent, or Firm* — Oliff PLC

(57) ABSTRACT

Provided is an optical unit and a display device capable of suppressing the occurrence of stray light by suppressing the incidence of light onto a peripheral region of a panel. In the optical unit, a first panel, a second panel, and a third panel are arranged to face a dichroic prism. A first light-emitting element is provided in a display region of the first panel, the second panel, and the third panel, and metal wiring is provided in a peripheral region. Here, a light shielding layer is provided between the dichroic prism and the peripheral region of each of the first panel, the second panel, and the third panel. Thus, even when a part of color light that should be reflected passes through a dichroic mirror, the leaked light is absorbed by the light shielding layer.

20 Claims, 20 Drawing Sheets

(51) Int. Cl.
   *G02B 27/01* (2006.01)
   *H10K 50/84* (2023.01)
   *H10K 50/86* (2023.01)
   *H10K 59/38* (2023.01)
   *H10K 59/126* (2023.01)
   *H10K 59/131* (2023.01)
   *H01L 27/32* (2006.01)
   *H01L 51/52* (2006.01)
   *F21V 8/00* (2006.01)

(52) U.S. Cl.
   CPC .......... *G02B 6/0035* (2013.01); *G02B 27/149* (2013.01); *G02B 2027/0114* (2013.01); *G02B 2027/0118* (2013.01); *G02B 2027/0178* (2013.01)

(56) References Cited

U.S. PATENT DOCUMENTS

| | | | |
|---|---|---|---|
| 6,049,364 | A | 4/2000 | Takahara et al. |
| 6,218,679 | B1 | 4/2001 | Takahara et al. |
| 6,259,423 | B1 | 7/2001 | Tokito et al. |
| 6,545,653 | B1 | 4/2003 | Takahara et al. |
| 6,882,379 | B1 | 4/2005 | Yokoyama et al. |
| 10,976,563 | B2 * | 4/2021 | Koshihara ........... H10K 50/852 |
| 2005/0146652 | A1 | 7/2005 | Yokoyama et al. |
| 2016/0103262 | A1 * | 4/2016 | Kashiwagi ............ G02B 5/223 |
| | | | 362/607 |
| 2017/0236879 | A1 | 8/2017 | Kubota |

FOREIGN PATENT DOCUMENTS

| | | |
|---|---|---|
| JP | 2001-330823 A | 11/2001 |
| JP | 2003-057746 A | 2/2003 |
| JP | 2009-109883 A | 5/2009 |
| JP | 2017-143022 A | 8/2017 |
| WO | WO-2016133886 A1 * | 8/2016 ........ B32B 37/1284 |

* cited by examiner

DISPLAY DEVICE

CROSS-REFERENCE TO RELATED APPLICATION(S)

This application is a continuation of U.S. application Ser. No. 16/364,671 filed Mar. 26, 2019, which is based on and claims priority under 35 U.S.C. 119 from Japanese Patent Application No. 2018-059468 filed on Mar. 27, 2018. The contents of the above applications are incorporated herein by reference.

BACKGROUND

1. Technical Field

The invention relates to an optical unit using a panel provided with a light emitting element, and a display device.

2. Related Art

As an optical unit using a panel provided with a light emitting element, and a display device, an aspect is conceivable in which three organic electroluminescent panels emitting light of each color are arranged facing incident surfaces of three dichroic prisms. With this optical unit and display device, while red image light emitted from the red color organic electroluminescent panel is reflected by a first dichroic mirror toward an emission surface, the first dichroic mirror allows blue image light emitted from the blue color organic electroluminescent panel and green image light emitted from the green color organic electroluminescent panel to pass through. Further, while the blue image light emitted from the blue color organic electroluminescent panel is reflected by a second dichroic mirror toward an emission surface, the second dichroic mirror allows the red image light emitted from the red color organic electroluminescent panel and the green image light emitted from the green color organic electroluminescent panel to pass through. Thus, synthesized light that is a synthesis of the images of the red light, the green light, and the blue light is emitted from the emission surfaces of the dichroic prisms, and a color image can thus be displayed (refer to JP-A-11-67448). Here, in the organic electroluminescent panel, normally, a plurality of organic electroluminescent elements are provided on a display region of a substrate, and wiring and the like is provided in a peripheral region surrounding the display region.

While the light emitted from a light emitting panel such as the organic electroluminescent panel includes oblique light that is significantly inclined with respect to a device optical axis, due to an influence of incident angle dependence of a dichroic mirror and the like, some of the color light that should be reflected sometimes passes through the dichroic mirror. In this case, the light that has passed through the dichroic mirror is obliquely incident on the peripheral region of another of the organic electroluminescent panels. Further, some of the color light that should pass through is reflected by the dichroic mirror, and is obliquely incident on the peripheral region of the organic electroluminescent panel concerned. In this case, the light that is incident on the peripheral region is obliquely reflected and becomes stray light, and there is a risk that the stray light may cause a quality of a displayed image to deteriorate.

SUMMARY

In light of the foregoing, an object of the invention is to provide an optical unit and a display device capable of suppressing the occurrence of stray light, by suppressing the incidence of light onto a peripheral region of a panel.

In order to solve the above-described problem, an aspect of an optical unit according to the invention includes a first panel provided with a first light-emitting element in a first display region that is a display region of a first substrate, a second panel provided with a second light-emitting element in a second display region that is a display region of a second substrate, a third panel provided with a third light-emitting element in a third display region that is a display region of a third substrate, and a dichroic prism. The dichroic prism is provided with a first incident surface that is disposed to face the first panel and on which image light emitted from the first display region is incident as first image light of a first wavelength range, a second incident surface that faces the first incident surface and that is disposed so as to face the second panel, and on which image light emitted from the second display region is incident as second image light of a second wavelength range that is different from the first wavelength range, and a third incident surface provided between the first incident surface and the second incident surface, and disposed to face the third panel, and on which image light emitted from the third display region is incident as third image light of a third wavelength range that is different from the first wavelength range and the second wavelength range. The dichroic prism is also provided with an emission surface that faces the third incident surface, a first dichroic mirror configured to reflect the first image light toward the emission surface and transmit the second image light and the third image light, and a second dichroic mirror configured to reflect the second image light toward the emission surface and transmit the first image light and the third image light. A light shielding layer that absorbs the light of the first wavelength range, the light of the second wavelength range, and the light of the third wavelength range is provided between the dichroic prism and a peripheral region surrounding the display region of at least one substrate of the first substrate, the second substrate, and the third substrate.

According to the invention, since the light shielding layer is provided between the dichroic prism and the peripheral region of the substrate of the panel, even when a part of color light that should be reflected passes through the dichroic mirror, or when part of the color light that should be transmitted is reflected by the dichroic mirror, the leaked light is blocked by the light shielding layer. Thus, the reflection of the leaked light on the peripheral region of the substrate can be suppressed, and as a result, the occurrence of stray light caused by the light reflected by the peripheral region of the substrate can be suppressed.

According to the invention, an aspect can be adopted in which a plurality of layers of wiring are provided in the peripheral region, and the light shielding layer is provided between the dichroic prism and the metal wiring, of the plurality of layers of wiring, positioned closest to the dichroic prism.

According to the invention, an aspect can be adopted in which, the light shielding layer is provided between the dichroic prism and the peripheral region surrounding the display region of another substrate, different from the one substrate, of the first substrate, the second substrate, and the third substrate.

According to the invention, an aspect can be adopted in which, the light shielding layer is provided between the dichroic prism and the peripheral region surrounding the display region of a remaining substrate, different from the one substrate and the other substrate, of the first substrate, the second substrate, and the third substrate.

According to the invention, an aspect can be adopted in which the light shielding layer is configured by a black filter layer including black particles, a light-absorbent metal layer, or a light-absorbent metal compound layer.

According to the invention, an aspect can be adopted in which a first coloring layer configured to color image light emitted from the first light-emitting element to be the first image light of the first wavelength range is provided in the first display region, a second coloring layer configured to color image light emitted from the second light-emitting element to be the second image light of the second wavelength range is provided in the second display region, and a third coloring layer configured to color image light emitted from the third light-emitting element to be the third image light of the third wavelength range is provided in the third display region. The light shielding layer is configured by providing, between the peripheral region of the substrate and the dichroic prism, a first color filter layer configured by the same material as the first coloring layer, a second color filter layer configured by the same material as the second coloring layer, and a third color filter layer configured by the same material as the third coloring layer, overlapping.

According to the invention, an aspect can be adopted in which the first color filter layer, the second color filter layer, and the third color filter layer are provided in the peripheral region of the first substrate, the first color filter layer, the second color filter layer, and the third color filter layer are provided in the peripheral region of the second substrate, and the first color filter layer, the second color filter layer, and the third color filter layer are provided in the peripheral region of the third substrate.

According to the invention, an aspect can be adopted in which, in the peripheral region of the first substrate, the second color filter layer and the third color filter layer are provided between the first substrate and the first color filter layer, in the peripheral region of the second substrate, the first color filter layer and the third color filter layer are provided between the second substrate and the second color filter layer, and in the peripheral region of the third substrate, the first color filter layer and the second color filter layer are provided between the third substrate and the third color filter layer.

According to the invention, an aspect can be adopted in which, of the first color filter layer, the second color filter layer, and the third color filter layer, only the first color filter layer is provided in the peripheral region of the first substrate, of the first color filter layer, the second color filter layer, and the third color filter layer, only the second color filter layer is provided in the peripheral region of the second substrate, and of the first color filter layer, the second color filter layer, and the third color filter layer, only the third color filter layer is provided in the peripheral region of the third substrate.

According to the invention, an aspect can be adopted in which the first color filter layer, the second color filter layer, and the third color filter layer are light-absorbent.

According to the invention, an aspect can be adopted in which a transmissive cover substrate is adhered to the one substrate, on a side of the dichroic prism, and the light shielding layer is provided between the one substrate and the cover substrate.

According to the invention, an aspect can be adopted in which a transmissive cover substrate is adhered to the one substrate, on a side of the dichroic prism, and the light shielding layer is provided between the cover substrate and the dichroic prism.

According to the invention, an aspect can be adopted in which, the light shielding layer is provided in a position separated from an effective luminous flux corresponding to a luminous flux emitted from the emission surface, of a luminous flux of image light emitted toward the dichroic prism from the display region of the one substrate.

According to the invention, an aspect can be adopted in which, the light shielding layer is provided in a position separated from an effective luminous flux used in display of an image, of a luminous flux of image light emitted toward the dichroic prism from the display region of the one substrate.

According to a display device provided with the optical unit to which the invention is applied, the display device is configured to display an image using synthesized light of the first image light, the second image light, and the third image light emitted from the emission surface of the dichroic prism.

According to a display device according to the invention, an aspect can be adopted in which the display device includes a virtual display unit configured to display a virtual image using the synthesized light.

According to the display device according to the invention, an aspect can be adopted in which the display device includes a projection optical system configured to project the synthesized light.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
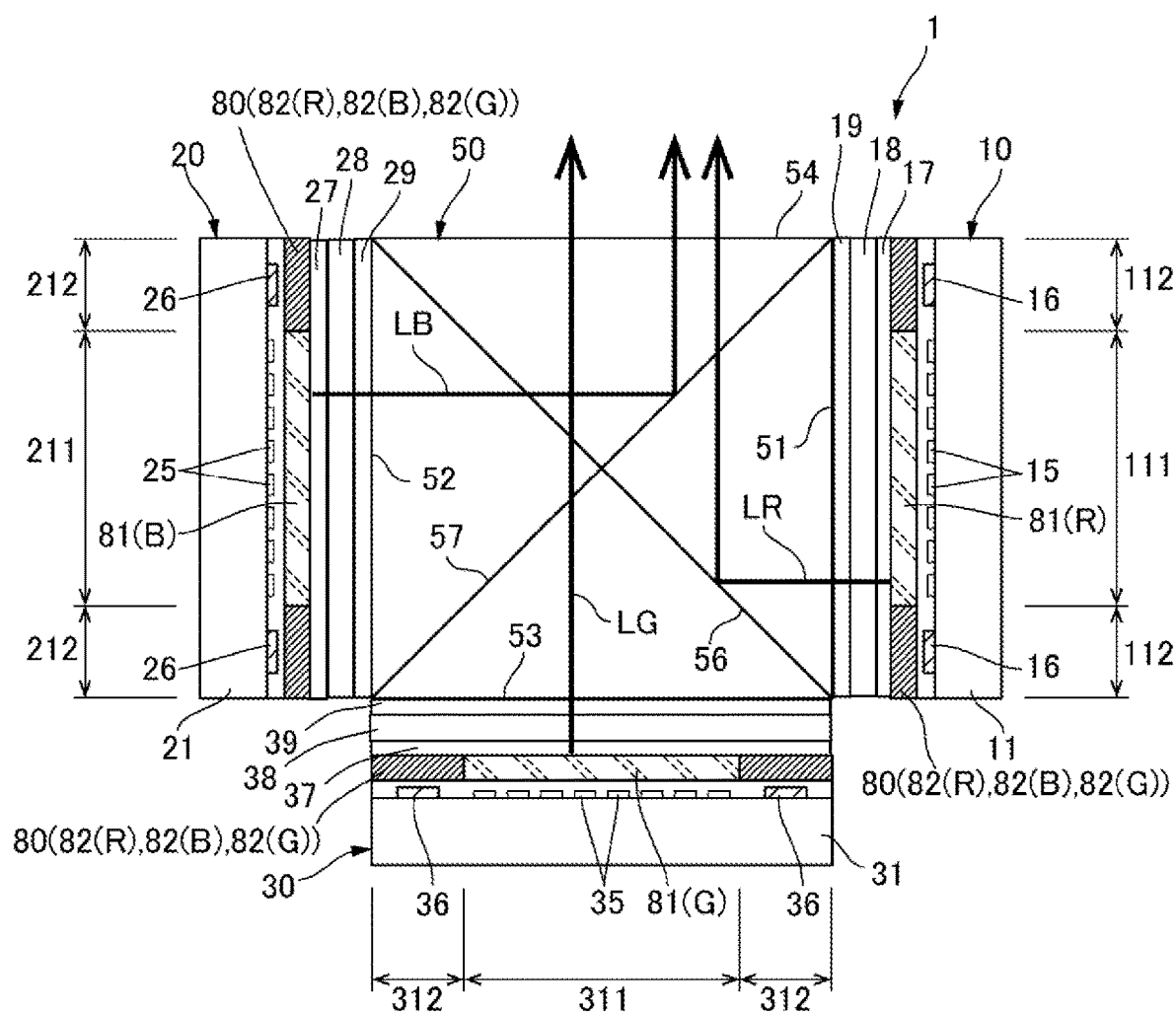
FIG. 1 is a plan view of an optical unit according to a first exemplary embodiment of the invention.

Exemplary embodiments of the invention will be described. Note that in the drawings referred to in the description below, to illustrate each layer or each member at a recognizable size on the drawings, a number and scale of each layer or each member is different.

First Exemplary Embodiment

Overall Configuration

Figure 2:
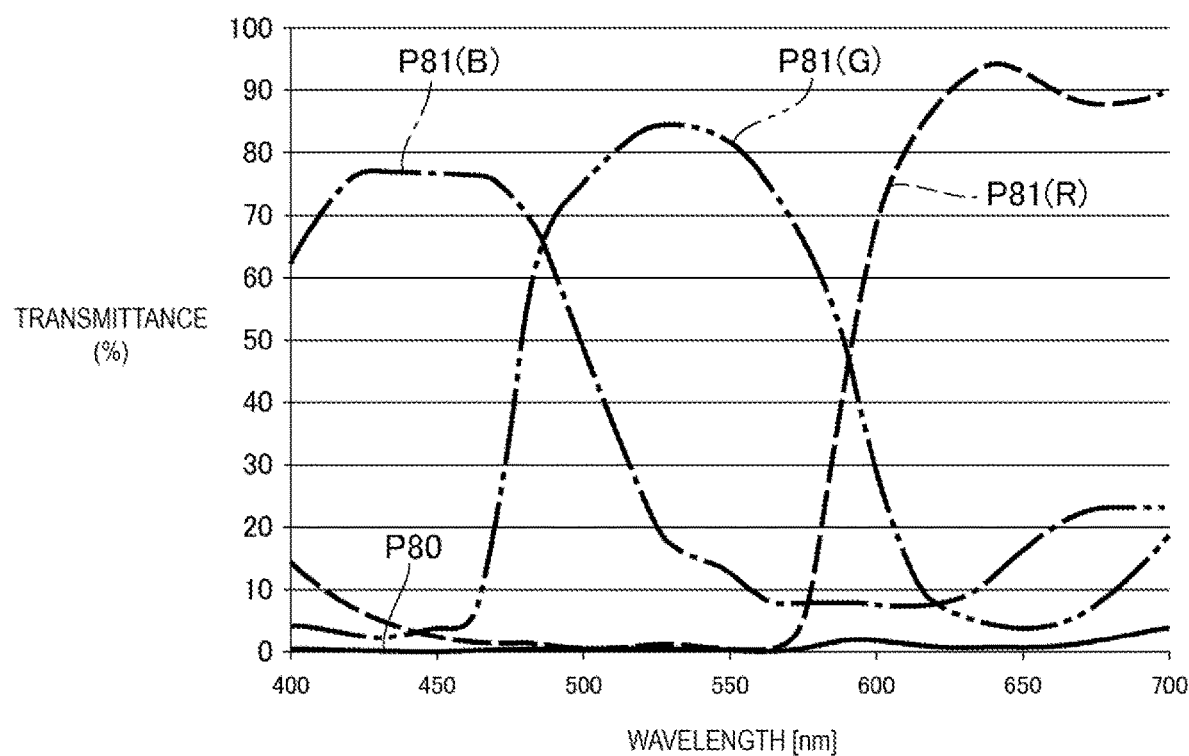
FIG. 2 is an explanatory diagram illustrating transmittance-wavelength characteristics of a first coloring layer and the like illustrated in FIG. 1.
Figure 3:
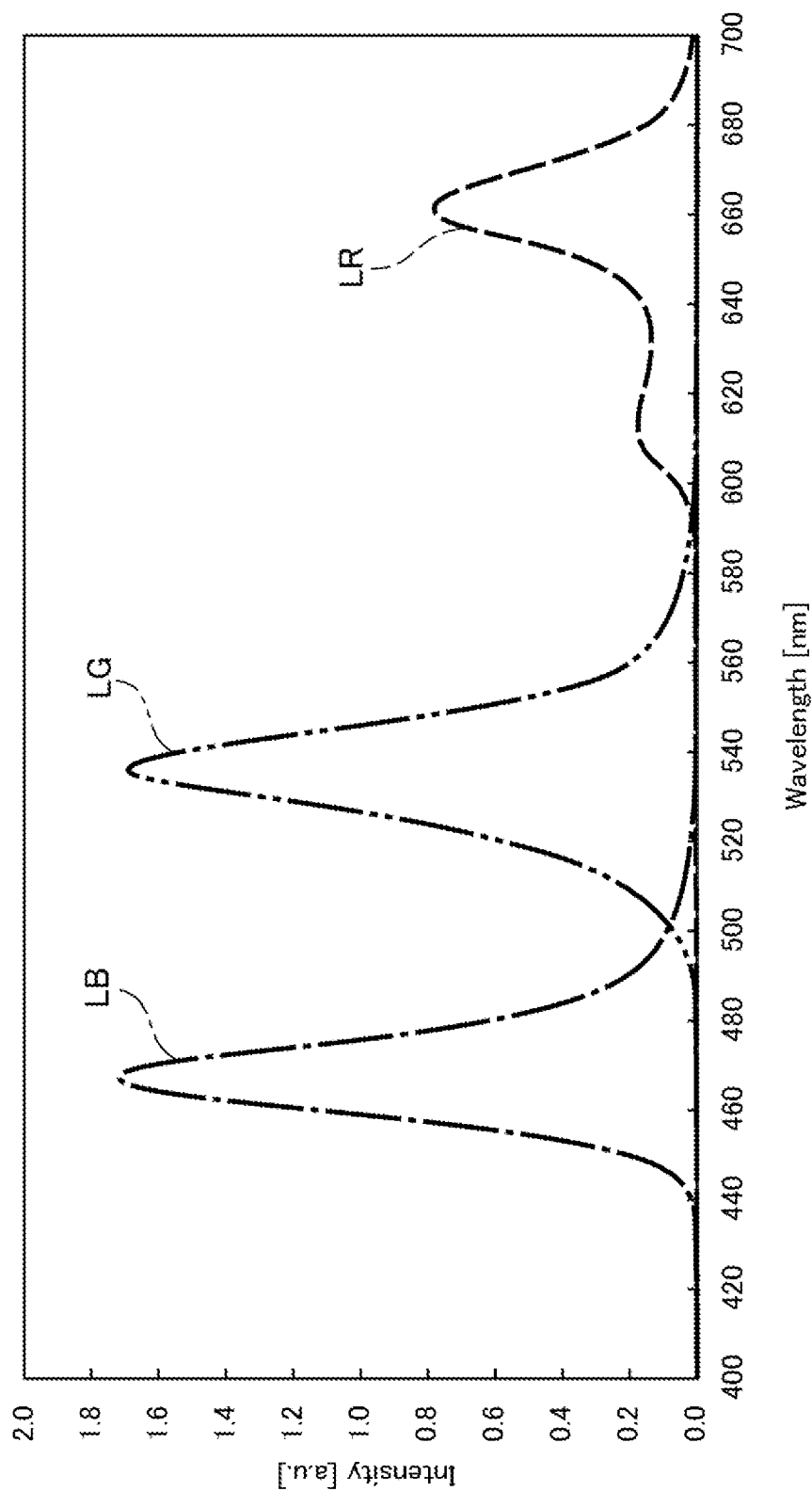
FIG. 3 is an explanatory diagram illustrating a spectrum of first image light and the like illustrated in FIG. 1.

FIG. 1 is a plan view of an optical unit 1 according to a first exemplary embodiment of the invention. FIG. 2 is an explanatory diagram illustrating transmittance-wavelength characteristics of a first coloring layer 81(R) and the like illustrated in FIG. 1. FIG. 3 is an explanatory diagram illustrating a spectrum of first image light LR and the like illustrated in FIG. 1.

As illustrated in FIG. 1, the optical unit 1 includes a first panel 10 provided with a plurality of first light-emitting elements 15 in a first display region 111 that is a display region of a first substrate 11, a second panel 20 provided with a plurality of second light-emitting elements 25 in a second display region 211 that is a display region of a second substrate 21, a third panel 30 provided with a plurality of light-emitting elements 35 in a display region 311 that is a display region of a third substrate 31, and a dichroic prism 50.

The first panel 10 emits the first image light LR of a first wavelength range from the first display region 111, and the second panel 20 emits second image light LB of a second wavelength range from the second display region 211. The third panel 30 emits third image light LG of a third wavelength range from the third display region 311. In the exemplary embodiment, the first wavelength range is from 620 nm to 750 nm, for example, and the first panel 10 emits the red color first image light LR. The second wavelength range is from 450 nm to 495 nm, for example, and the second panel 20 emits the blue color second image light LB. The third wavelength range is from 495 nm to 570 nm, for example, and the third panel 30 emits the green color third image light LG.

In the exemplary embodiment, as a result of emitting white light from the plurality of first light-emitting elements 15 provided in the first display region 111, in the first substrate 11, on the side of the dichroic prism 50 with respect to the first light-emitting elements 15, the first panel 10 has a first coloring layer 81(R) that colors the image light emitted from the first light-emitting elements 15 to be into the first image light LR of the first wavelength range. As a result of emitting white light from the plurality of second light-emitting elements 25 provided in the second display region 211, in the second substrate 21, on the side of the dichroic prism 50 with respect to the second light-emitting elements 25, the second panel 20 has a second coloring layer 81(B) that colors the image light emitted from the second light-emitting elements 25 to be the second image light LB of the second wavelength range. As a result of emitting white light from the plurality of third light-emitting elements 35 provided in the third display region 311, in the third substrate 31, on the side of the dichroic prism 50 with respect to the third light-emitting elements 35, the third panel 30 has a third coloring layer 81(G) that colors the image light emitted from the third light-emitting elements 35 to be the third image light LG of the third wavelength range. In the exemplary embodiment, the first light-emitting elements 15, the second light-emitting elements 25, and the third light-emitting elements 35 are all the organic electroluminescent elements.

In the exemplary embodiment, the first coloring layer 81(R) has the transmittance-wavelength characteristics indicated by a dashed line P81(R) in FIG. 2, and is a light-absorbing filter layer that absorbs light other than the red light. The second coloring layer 81(B) has the transmittance-wavelength characteristics indicated by a one-dot chain line P81(B) in FIG. 2, and is a light absorbing filter layer that absorbs light other than the blue light. The third coloring layer 81(G) has the transmittance-wavelength characteristics indicated by a two-dot chain line P81(G) in FIG. 2, and is a light absorbing filter layer that absorbs light other than the green light. Thus, the first image light LR has a spectrum indicated by a dashed line LR in FIG. 3, the second image light LB has a spectrum indicated by a one-dot chain line LB in FIG. 3, and the third image light LG has a spectrum indicated by a two-dot chain line LG in FIG. 3.

The dichroic prism 50 includes a first incident surface 51, a second incident surface 52 that faces the first incident surface 51, a third incident surface 53 that is provided between the first incident surface 51 and the second incident surface 52, and an emission surface 54 that faces the third incident surface 53. The first panel 10 is arranged so as to face the first incident surface 51, and the first image light LR emitted from the first panel 10 is incident on the first incident surface 51. The second panel 20 is arranged so as to face the second incident surface 52, and the second image light LB emitted from the second panel 20 is incident on the second incident surface 52. The third panel 30 is arranged so as to face the third incident surface 53, and the third image light LG emitted from the third panel 30 is incident on the third incident surface 53. In the exemplary embodiment, the first incident surface 51 and the first panel 10 are fixed by a transmissive adhesive 19, the second incident surface 52 and the second panel 20 are fixed by a transmissive adhesive 29, and the third incident surface 53 and the third panel 30 are fixed by a transmissive adhesive 39.

The dichroic prism 50 includes a first dichroic mirror 56, and a second dichroic mirror 57 that are arranged so as to intersect each other at a 45 degree angle.

Optical Characteristics of Dichroic Prism 50

Figure 4:
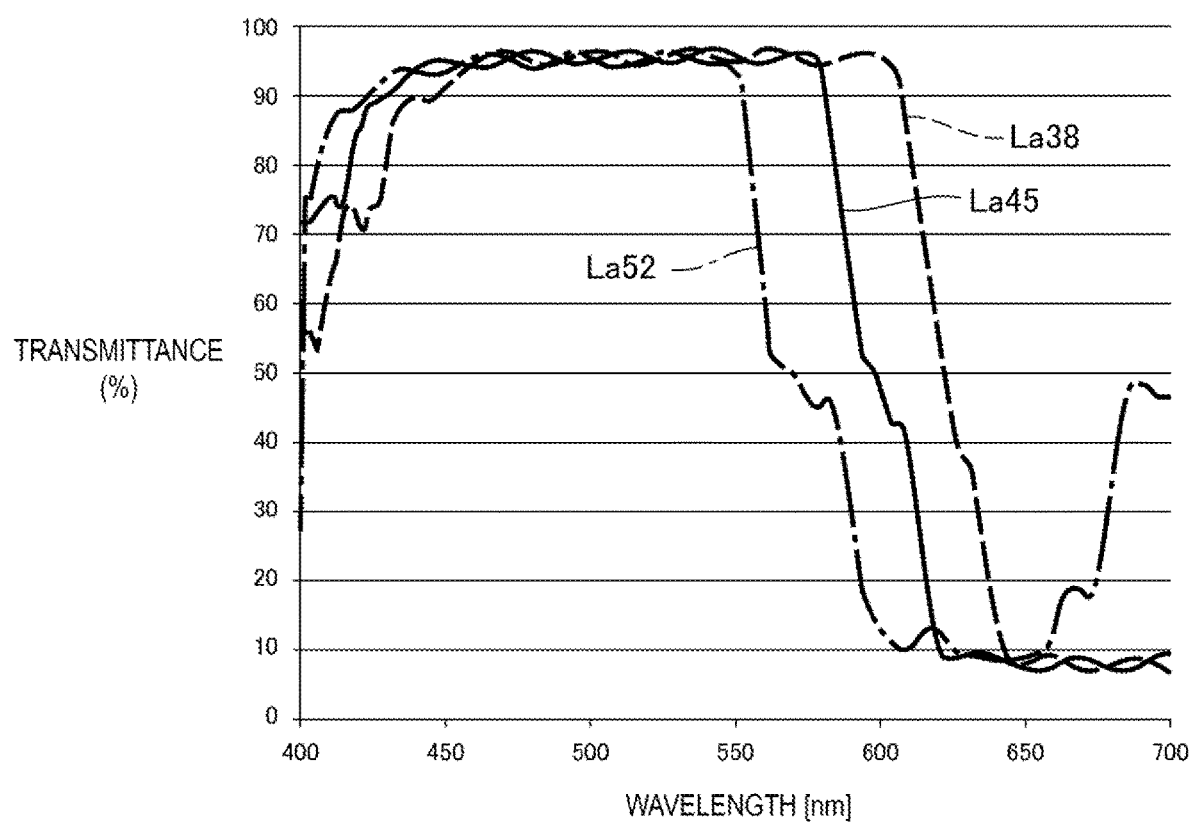
FIG. 4 is a graph illustrating transmittance-wavelength characteristics of a first dichroic mirror illustrated in FIG. 1.
Figure 5:
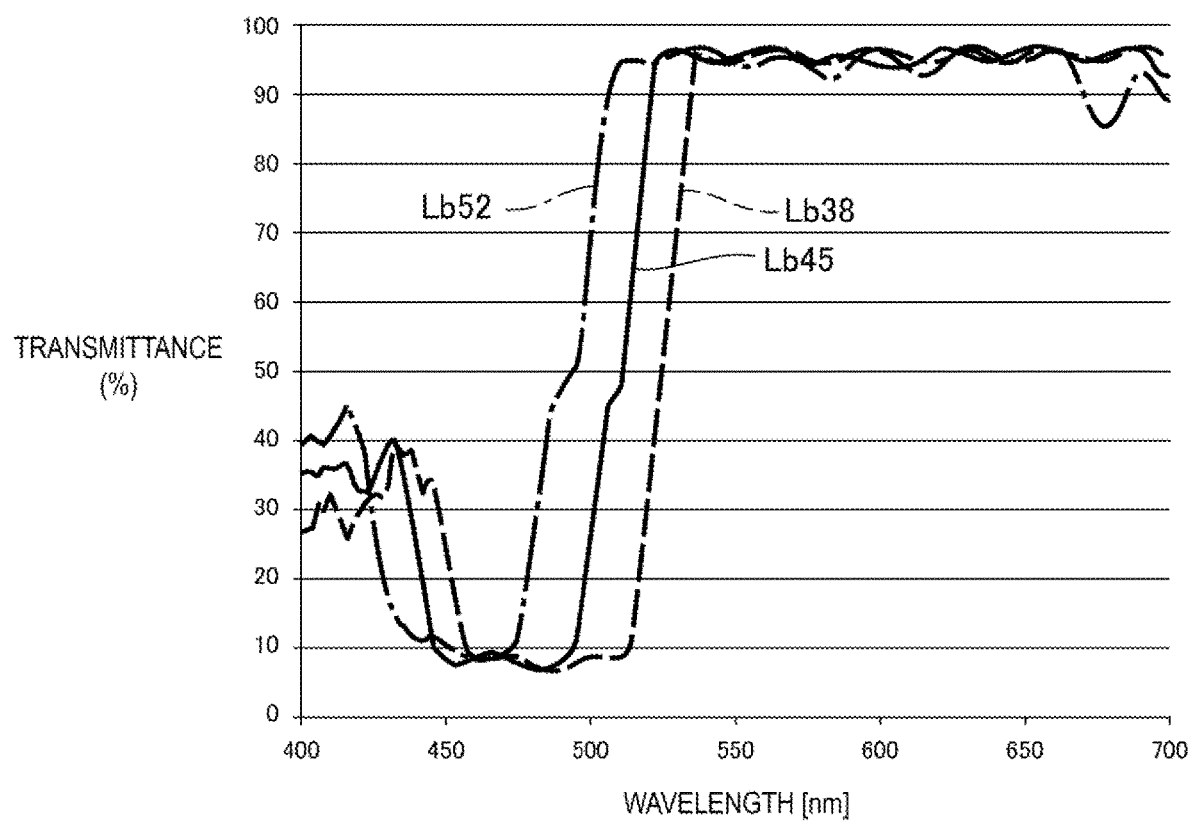
FIG. 5 is a graph illustrating transmittance-wavelength characteristics of a second dichroic mirror illustrated in FIG. 1.

FIG. 4 is a graph illustrating transmittance-wavelength characteristics of the first dichroic mirror 56 illustrated in FIG. 1. FIG. 5 is a graph illustrating transmittance-wavelength characteristics of the second dichroic mirror 57 illustrated in FIG. 1.

As indicated by a solid line La45 in FIG. 4, of light that is incident at the 45 degree angle, the first dichroic mirror 56 allows the light having a wavelength of 550 nm or less to pass through and reflects the light having a wavelength of 600 nm or greater. Further, of the light having a wavelength from 550 nm to 600 nm, the longer the wavelength, the lower the transmittance. Thus, the first dichroic mirror 56 reflects the first image light LR toward the emission surface 54 and allows the second image light LB and the third image light LG to pass through.

As indicated by a solid line Lb45 in FIG. 5, of light that is incident at the 45 degree angle, the second dichroic mirror 57 allows the light having a wavelength of 520 nm or greater to pass through and reflects the light having a wavelength of 490 nm or less. Further, of the light having a wavelength from 490 nm to 520 nm, the longer the wavelength, the greater the transmittance. Thus, the second dichroic mirror 57 reflects the second image light LB toward the emission surface 54 and allows the first image light LR and the third image light LG to pass through. Thus, the dichroic prism 50 emits, from the emission surface 54, a color image obtained by synthesizing the first image light LR emitted from the first panel 10, the second image light LB emitted from the second panel 20, and the third image light LG emitted from the third panel 30.

Note that the transmittance and the reflectance of the first dichroic mirror 56 are incident angle dependent. For example, with respect to the first dichroic mirror 56, as indicated by a dashed line La38 in FIG. 4, the wavelength range that passes through shifts more to the long wavelength side when the incident angle is 38 degrees than when the incident angle is 45 degrees, and as indicated by a one-dot chain line La52 in FIG. 4, the wavelength range that passes through shifts more to the short wavelength side when the incident angle is 52 degrees than when the incident angle is 45 degrees. Note that, similarly to the first dichroic mirror 56, the transmittance and the reflectance of the second dichroic mirror 57 are incident angle dependent. For example, for the second dichroic mirror 57, as indicated by a dashed line Lb38 in FIG. 5, the wavelength range that passes through shifts more to the long wavelength side when the incident angle is 38 degrees than when the incident angle is 45 degrees, and as indicated by a one-dot chain line Lb52 in FIG. 5, the wavelength range that passes through shifts more to the short wavelength side when the incident angle is 52 degrees than when the incident angle is 45 degrees.

Electrical Configuration of First Panel 10

Figure 6:
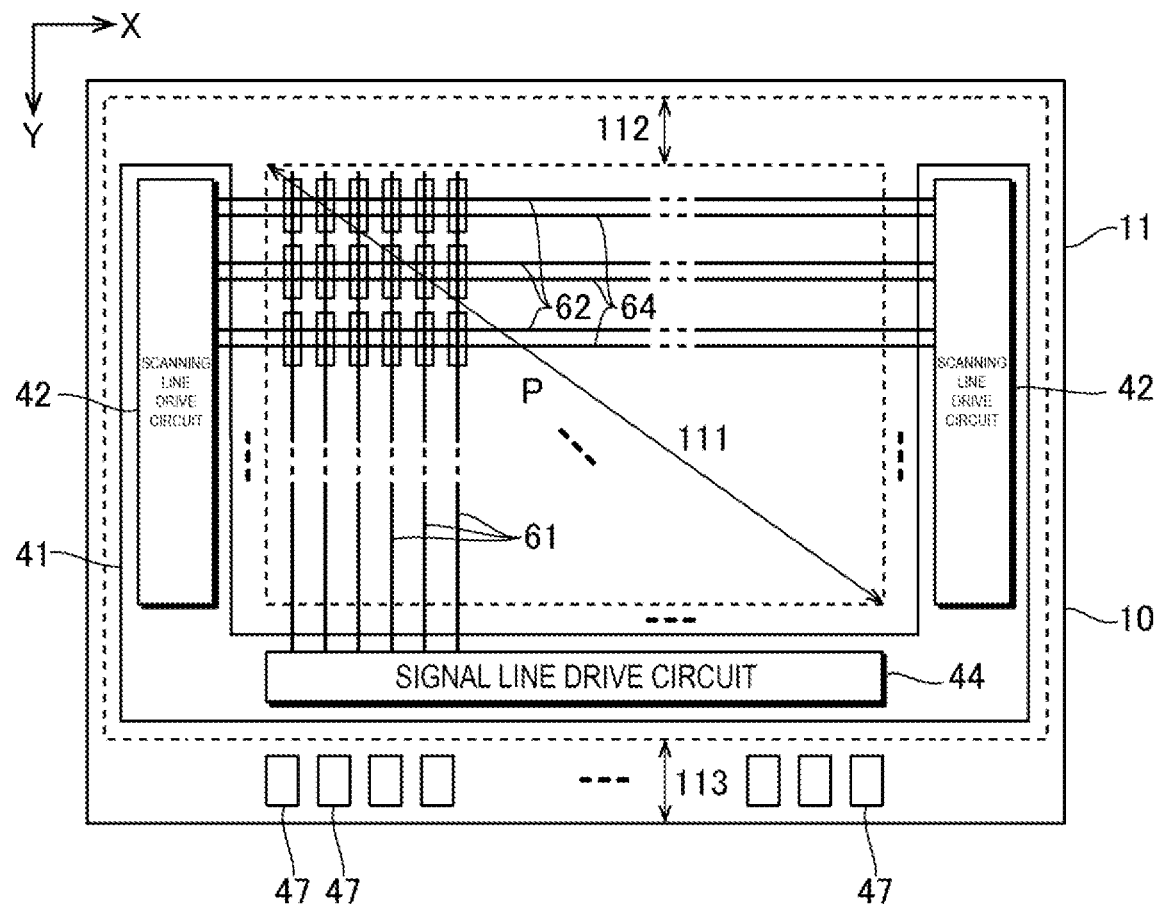
FIG. 6 is an explanatory diagram illustrating an electrical configuration of a first panel illustrated in FIG. 1.
Figure 7:
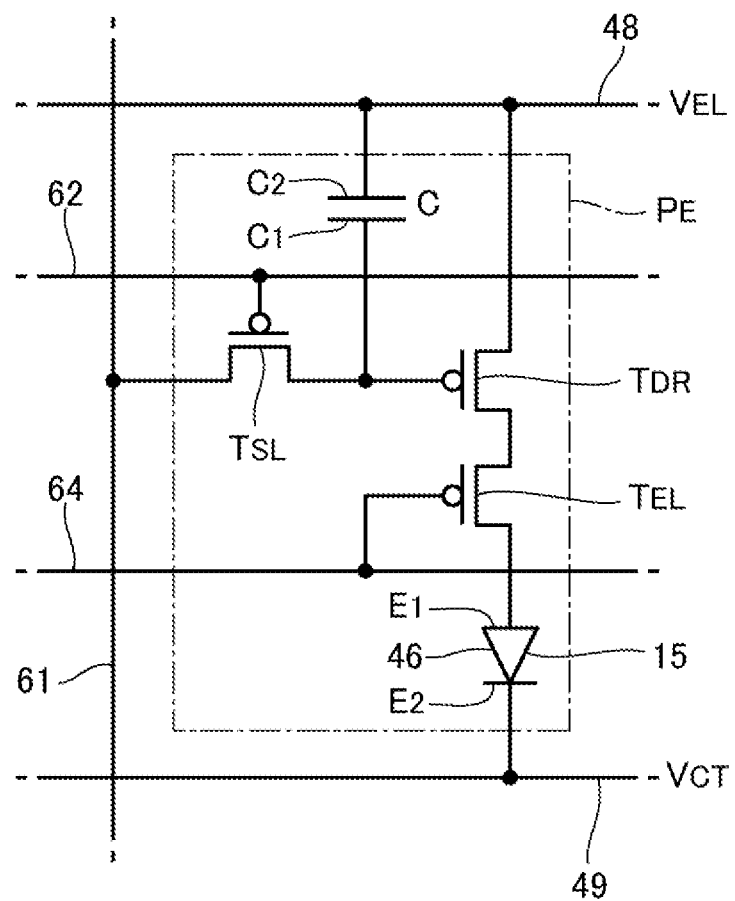
FIG. 7 is a circuit diagram of each of pixels (pixel circuits) in a first display region illustrated in FIG. 6.

FIG. 6 is an explanatory diagram illustrating an electrical configuration of the first panel 10 illustrated in FIG. 1. FIG. 7 is a circuit diagram of each of pixels (pixel circuits) in the first display region 111 illustrated in FIG. 6. Note that, in the following explanation, an "upper layer side" and an "upper surface" refer to an opposite side to the first substrate 11.

As illustrated in FIG. 6, in the first panel 10, the first display region 111, a peripheral region 112, and a mounting region 113 are provided on one surface of the first substrate 11. In the exemplary embodiment, the first substrate 11 is a silicon semiconductor substrate or the like. In the first substrate 11, the first display region 111 is a rectangular region in which a plurality of pixels P are arrayed. A plurality of scanning lines 62 that extend in an X direction, a plurality of control lines 64 that extend in the X direction in correspondence to each of the scanning lines 62, and a plurality of signal lines 61 that extend in a Y direction intersecting the X direction are formed in the first display region 111. The pixels P are formed corresponding to each intersection of the plurality of scanning lines 62 and the plurality of signal lines 61. Thus, the plurality of pixels P are arrayed in a matrix over the X direction and the Y direction.

The peripheral region 112 is a rectangular frame-shaped region that surrounds the periphery of the first display region 111. A drive circuit 41 is provided in the peripheral region 112. The drive circuit 41 is a circuit that drives each of the pixels P inside the first display region 111, and is configured so as to include two scanning line drive circuits 42 and a signal line drive circuit 44. The first panel 10 of the exemplary embodiment is a circuit incorporating display device in which the drive circuit 41 is configured by active elements, such as a transistor, formed directly on the surface of the first substrate 11.

The mounting region 113 is a region on the opposite side of the first display region 111 with the peripheral region 112 positioned therebetween, and a plurality of mounting terminals 47 are arrayed in the mounting region 113. Control signals and a power supply potential are supplied to each of the mounting terminals 47 from various external circuits (not illustrated), such as a control circuit and a power supply circuit. The external circuits are mounted on a flexible circuit board (not illustrated) that is bonded to the mounting region 113, for example.

As illustrated in FIG. 7, the pixel P is configured so as to include the first light-emitting element 15, a drive transistor TDR, a light emission control transistor TEL, a selection transistor TSL, and a capacitative element C. Note that, in FIG. 7, each of the transistors T (TDR, TEL, and TSL) of the pixel P are p-channel type transistors, but n-channel type transistors can also be used.

The first light-emitting element 15 is an electro-optical element in which a light-emitting functional layer 46 that includes a light-emitting layer of an organic EL material is interposed between a first electrode E1 (a positive electrode) and a second electrode E2 (a negative electrode). The first electrode E1 is formed individually for each of the pixels P, and the second electrode E2 is continuous across the plurality of pixels P. The first light-emitting element 15 is arranged on a current path that connects a first power supply conductor 48 and a second power supply conductor 49. The first power supply conductor 48 is a power supply line to which a higher-side power supply potential (a first potential) VEL is supplied, and the second power supply conductor 49 is a power supply line to which a lower-side power supply potential (a second potential) VCT is supplied.

The drive transistor TDR and the light emission control transistor TEL are arranged on the current path that connects the first power supply conductor 48 and the second power supply conductor 49, in series with the first light-emitting element 15. Specifically, one side (the source) of a pair of current terminals of the drive transistor TDR is connected to the first power supply conductor 48. The light emission control transistor TEL functions as a switch that controls a conductive state (conductive/non-conductive) between the other side (the drain) of the pair of current terminals of the drive transistor TDR, and the first electrode E1 of the first light-emitting element 15. The drive transistor TDR generates a drive current of an amperage corresponding to a voltage between a gate and the source of the drive transistor TDR. In a state in which the light emission control transistor TEL is controlled to be ON, the drive current is supplied from the drive transistor TDR to the first light-emitting element 15 via the light emission control transistor TEL, and the light-emitting element 15 thus emits light at a luminance corresponding to the amperage of the drive current. In a state in which the light emission control transistor TEL is controlled to be OFF, the supply of the drive current to the first light-emitting element 15 is cut off, and the light-emitting element 15 is thus extinguished. A gate of the light emission control transistor TEL is connected to the control line 64.

The selection transistor TSL functions as a switch that controls a conductive state (conductive/non-conductive) between the signal line 61 and the gate of the drive transistor TDR. A gate of the selection transistor TSL is connected to the scanning line 62. Further, the capacitative element C is an electrostatic capacitance obtained by interposing a dielectric substance between a first electrode C1 and a second electrode C2. The first electrode C1 is connected to the gate of the drive transistor TDR, and the second electrode C2 is connected to the first power supply conductor 48 (the source of the drive transistor TDR). Thus, the capacitative element C holds the voltage between the gate and source of the drive transistor TDR.

The signal line drive circuit 44 supplies a grayscale potential (a data signal) depending on a grayscale specified for each of the pixels P by an image signal supplied from an external circuit, to the plurality of signal lines 61, in parallel, for each write period (horizontal scanning period). Meanwhile, by supplying a scanning signal to each of the scanning lines 62, each of the scanning line drive circuits 42 sequentially selects each of the plurality of scanning lines 62 for each write period. The selection transistor TSL of each of the pixels P corresponding to the scanning line 62 selected by the scanning line drive circuits 42 switches to an ON state. Thus, the grayscale potential is supplied to the gate of the drive transistor TDR of each of the pixels P, via the signal line 61 and the selection transistor TSL, and the voltage according to the grayscale potential is held in the capacitative element C. Meanwhile, when the selection of the scanning lines 62 in the write period ends, each of the scanning line drive circuits 42 supplies a control signal to each of the control lines 64, thus controlling the light emission control transistor TEL of each of the pixels P corresponding to the control lines 64 to be in an ON state. Thus, a drive current that accords with the voltage held in the capacitative element C in the immediately preceding write period is supplied to the first light-emitting element 15 from the drive transistor TDR via the light emission control transistor TEL. In this way, the first light-emitting element 15 emits light at a luminance that accords with the grayscale potential. As a result, the desired first image light LR specified by the image signal is emitted from the first display region 111.

Cross-Sectional Configuration of First Panel 10

Figure 8:
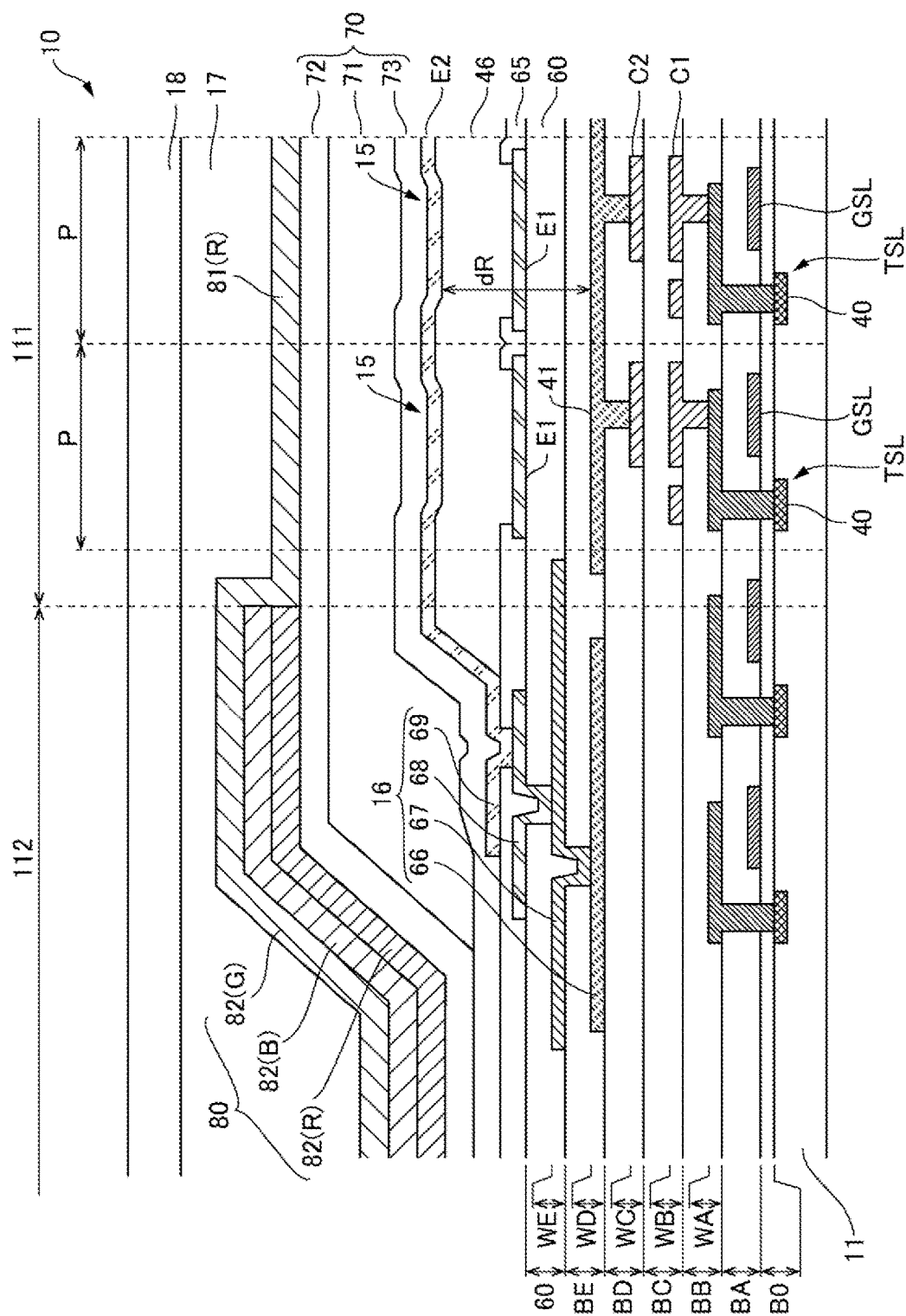
FIG. 8 is a cross-sectional view of the first panel illustrated in FIG. 1.

FIG. 8 is a cross-sectional view of the first panel 10 illustrated in FIG. 1. As illustrated in FIG. 8, a transistor active region 40 (a source/drain region) for the selection transistor TSL of the pixel P and the like, is formed on the first substrate 11, and the upper surface of the active region 40 is covered by an insulating film BO (a gate insulating film). A gate electrode G is formed on the upper surface of the insulating film BO. A multilayer wiring layer, in which a plurality of insulating layers BA to BE and a plurality of wiring layers WA to WE are alternately laminated, is formed on the upper layer side of the gate electrode G. Each of the wiring layers is formed of a low-resistance conductive material that contains aluminum, silver, or the like. The wiring layer WA that includes the scanning lines 62 and the like illustrated in FIG. 7 is formed on the upper surface of the insulating film BA. The wiring layer WB that includes the signal lines 61, the first electrodes C1 and the like illustrated in FIG. 7 is formed on the upper layer of the insulating layer BB. The wiring layer WC that includes the second electrodes C2 and the like illustrated in FIG. 7 is formed on the surface layer of the insulating layer BC. The wiring layer WD that includes the first power supply conductors 48 and the like illustrated in FIG. 7 is formed on the surface layer of the insulating layer BD. The wiring layer WE that includes wiring 69, wiring 67 and the like is formed on the upper layer of the insulating layer BE.

An optical path adjusting layer 60 is formed on the upper layer of the insulating layer BE. The optical path adjusting layer 60 is an element used to set a resonance wavelength of an optical resonator to an appropriate wavelength, and is formed of a light-transmissive insulating material of silicon nitride, silicon oxide or the like. Specifically, by appropriately adjusting an optical path length dR (an optical distance) between the first power supply conductor 48 and the second electrode E2 that configure the optical resonator, in accordance with a film thickness of the optical path adjusting layer 60, the resonance wavelength is set with respect to the light emitted from the first panel 10. In the exemplary embodiment, since the red first image light LR is emitted from the first panel 10, the optical path length of the optical resonator is set to a value appropriate for the first image light LR.

The first electrode E1 is formed on the upper surface of the optical path adjusting layer 60, for each of the pixels P in the first display region 111. The first electrode E1 is formed of a light-transmissive conductive material, such as indium tin oxide (ITO), for example. An insulating pixel defining layer 65 is formed around the first electrode E1. The light-emitting functional layer 46 is formed on the upper surface of the first electrode E1. The light-emitting functional layer 46 is configured to contain the light-emitting layer formed by the organic EL material, and irradiates white light as a result of the supply of current. A transport layer or an injection layer of electrons or positive holes supplied to the light-emitting layer is sometimes provided in the light-emitting functional layer 46. The light-emitting functional layer 46 is formed continuously over the plurality of pixels P in the first display region 111.

The second electrode E2 is formed on the upper layer of the light-emitting functional layer 46, over the entire area of the first display region 111, and, of the light-emitting functional layer 46, a region (a light-emitting region) sandwiched by the first electrode E1 and the second electrode E2 emits light. The second electrode E2 allows some of the light that has reached it to pass through, and also functions as a semitransparent reflection layer that reflects back the rest of the light. For example, by forming a photoreflective conductive material, such as an alloy or the like containing silver or magnesium, of a sufficiently thin film thickness, the semitransparent reflective electrode E2 is formed. The radiated light from the light-emitting functional layer 46 reciprocates between the first power supply conductor 48 and the second electrode E2, and components of a particular resonance wavelength are selectively amplified. Then, the reciprocating light passes through the second electrode E2 and is emitted to an observation side (the opposite side to the first substrate 11). In other words, an optical resonator is formed that causes the light emitted from the light-emitting functional layer 46 to resonate between the first power supply conductor 48 that functions as the reflection layer and the second electrode E2 that functions as the semitransparent reflection layer.

Here, in the peripheral region 112, the wiring 66, 67, 68, 69, and the like are formed in the same layers as the conductive layers formed in the first display region 111, and the wiring 66, 67, 68, and 69 are electrically connected via contact holes of the insulating layers formed between the wiring, for example.

A sealing body 70 is formed on the upper layer side of the second electrode E2, over the entire area of the first substrate 11. The sealing body 70 is a light-transmissive film body that seals each of the structural elements formed on the first substrate 11 and prevents the infiltration of outside air and moisture, and is configured by a laminated film of a first sealing layer 71, a second sealing layer 72, and a third sealing layer 73, for example. The third sealing layer 73 is formed on the upper layer of the second electrode E2 and is in direct contact with the upper surface of the second electrode E2. The third sealing layer 73 is an insulating inorganic material such as a silicon compound (typically, silicon nitride or silicon oxide), for example. The first sealing layer 71 functions as a flattening film that buries level differences of the surface of the second electrode E2 and the third sealing layer 73. The first sealing layer 71 is formed of a light-transmissive organic materials, such as an epoxy resin, for example. The second sealing layer 72 is formed over the entire area of the first substrate 11. The second sealing layer 72 is formed of a silicon nitride compound, a silicon oxide compound, or the like, for example, which offer excellent water-resistant and heat-resistant properties.

The first coloring layer 81(R) is formed on the upper surface of the sealing body 70 (the second sealing layer 72). The first coloring layer 81(R) allows the red light of the first wavelength range to pass through. Further, in the first panel 10, a transmissive cover substrate 18 is fixed to the first coloring layer 81(R), on the opposite side to the first substrate 11, by an adhesive 17.

Configuration of Second Panel 20 and Third Panel 30

Figure 9:
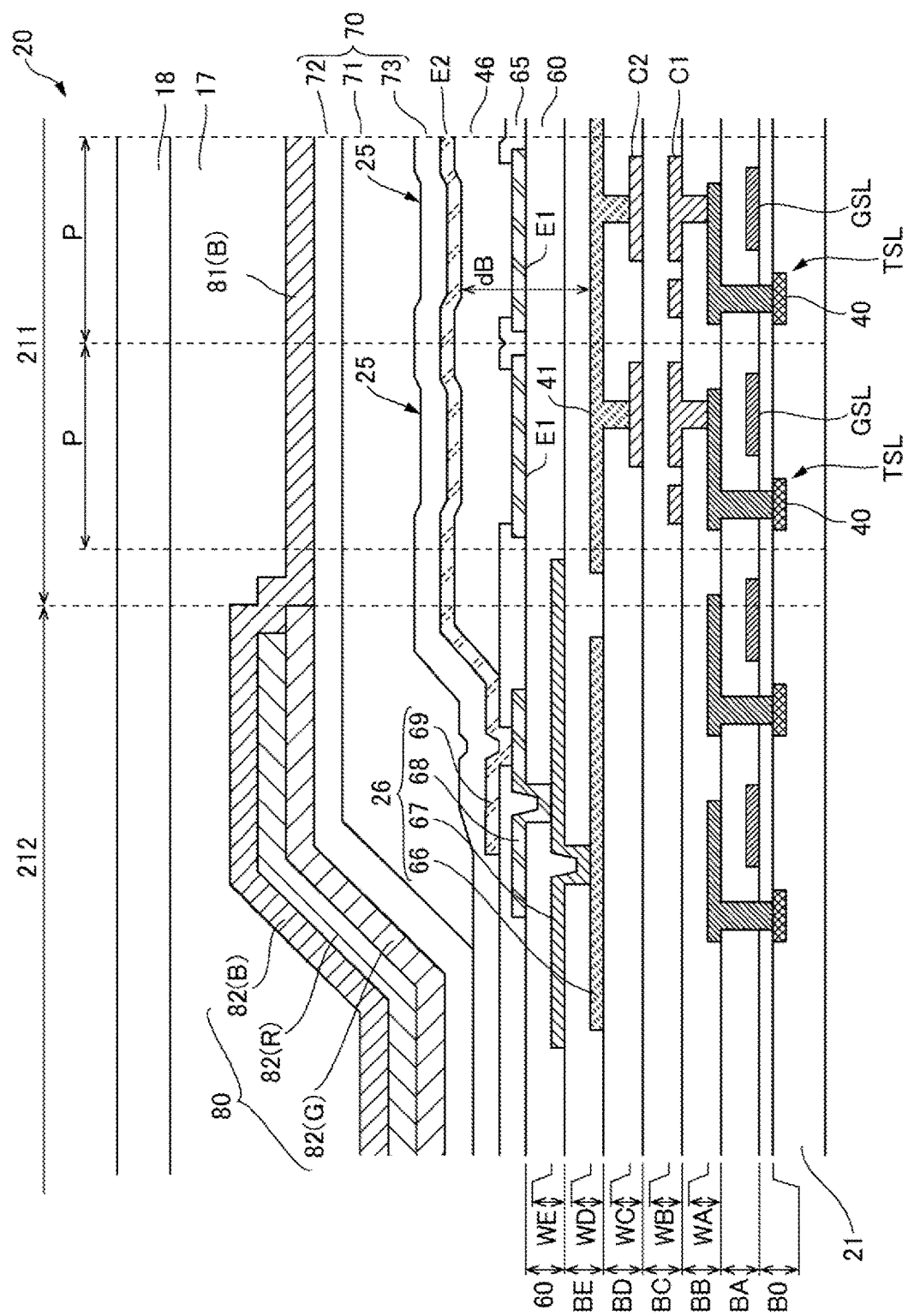
FIG. 9 is a cross-sectional view of a second panel illustrated in FIG. 1.
Figure 10:
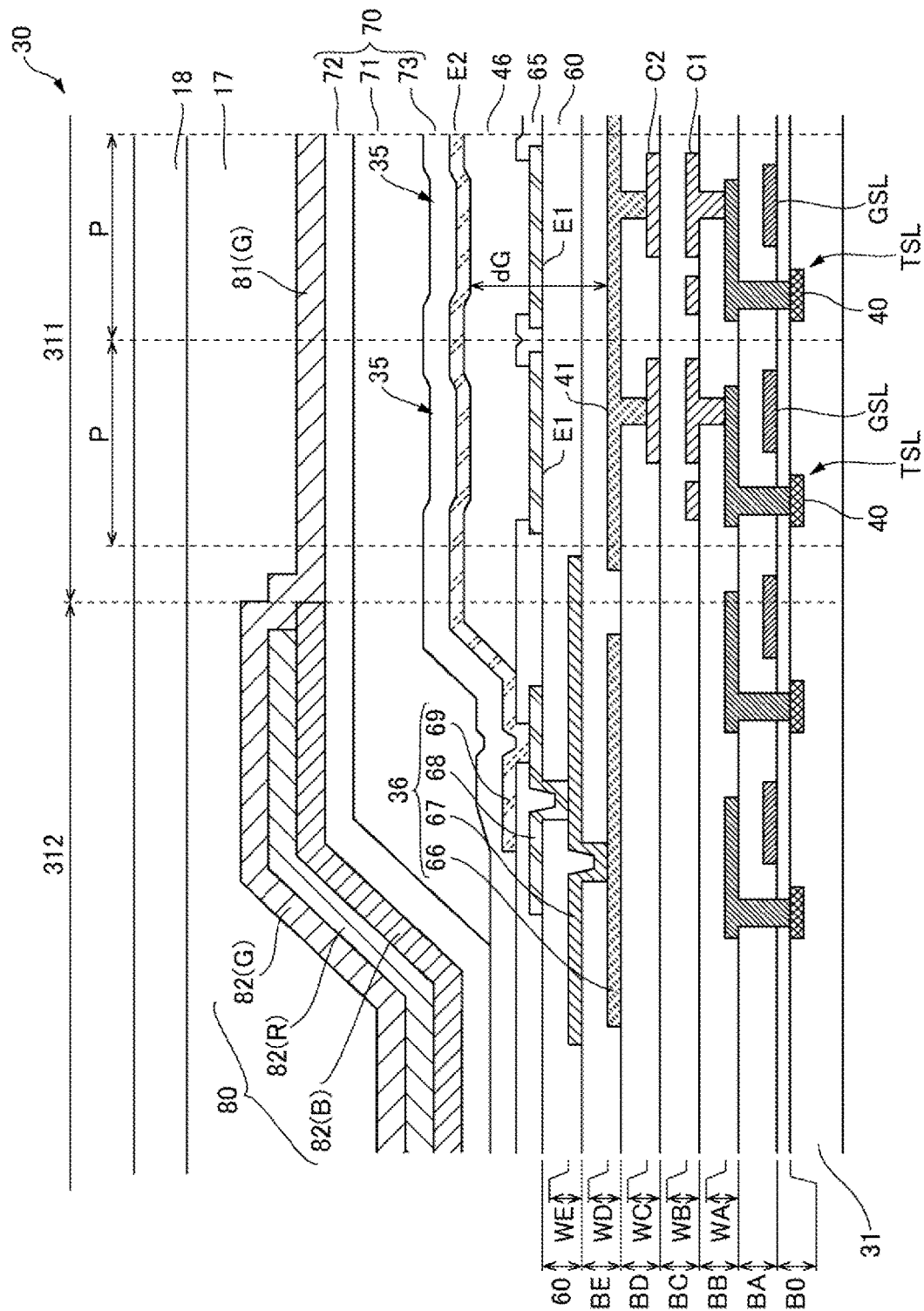
FIG. 10 is a cross-sectional view of a third panel illustrated in FIG. 1.

FIG. 9 is a cross-sectional view of the second panel 20 illustrated in FIG. 1. FIG. 10 is a cross-sectional view of the third panel 30 illustrated in FIG. 1. Similar to the first panel 10, the second panel 20 and the third panel 30 illustrated in FIG. 1 have the electrical configuration explained with reference to FIG. 6 and FIG. 7, and the second light-emitting elements 25 and the third light-emitting elements 35 are formed in place of the first light-emitting elements 15.

As illustrated in FIG. 9, in the second panel 20, in place of the first coloring layer 81(R) explained with reference to FIG. 8, the second coloring layer 81(B) is formed, and the second coloring layer 81(B) allows the blue light of the second wavelength range to pass through. Further, the film thickness of the optical path adjusting layer 60 illustrated in FIG. 9 is adjusted to correspond to the wavelength of the blue second image light LB emitted from the second panel 20, and an optical path length dB (the optical distance) between the first power supply conductor 48 and the second electrode E2 that configure the optical resonator is optimized. Further, in the second panel 20, a transmissive cover substrate 28 is fixed to the second coloring layer 81(B), on the opposite side to the second substrate 21, by an adhesive 27.

As illustrated in FIG. 10, in the third panel 30, in place of the first coloring layer 81(R) explained with reference to FIG. 8, the third coloring layer 81(G) is formed, and the third coloring layer 81(G) allows the green light of the third wavelength range to pass through. Further, the film thickness of the optical path adjusting layer 60 illustrated in FIG. 10 is adjusted to correspond to the wavelength of the green third image light LG emitted from the third panel 30, and an optical path length dG (the optical distance) between the first power supply conductor 48 and the second electrode E2 that configure the optical resonator is optimized. Further, in the third panel 30, a transmissive cover substrate 38 is fixed to the third coloring layer 81(G), on the opposite side to the third substrate 31, by an adhesive 37.

Configuration of Light Shielding Layer 80

Figure 11:
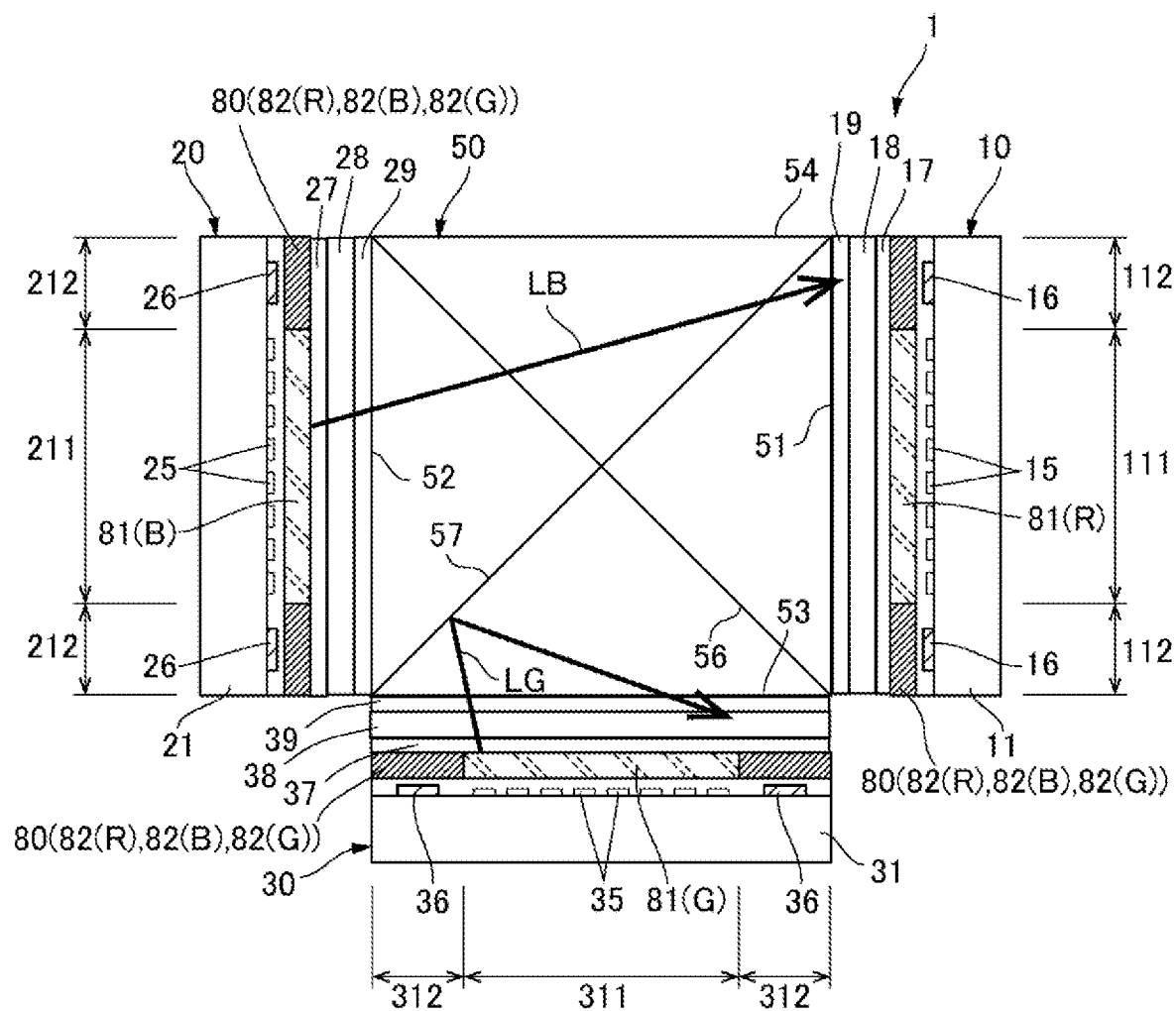
FIG. 11 is an explanatory diagram illustrating effects of a light shielding layer and the like illustrated in FIG. 1.

FIG. 11 is an explanatory diagram illustrating effects of a light shielding layer 80 illustrated in FIG. 1 and the like. Returning once again to FIG. 1, the optical unit 1 of the exemplary embodiment uses the light (the first image light LR, the second image light LB, and the third image light LG) emitted from the light-emitting elements (the first light-emitting elements 15, the second light-emitting elements 25, and the third light-emitting elements 35), such as the organic electroluminescent elements and the like. Thus, the first image light LR, the second image light LB, and the third image light LG include the oblique light that is significantly inclined with respect to the device optical axis. Meanwhile, in the dichroic prism 50, in the dichroic mirrors (the first dichroic mirror 56, and the second dichroic mirror 57), due to the influence of the incident angle dependence and the like, some of the color light that should be reflected passes through the dichroic mirrors, and some of the color light that should be allowed to pass through is reflected by the dichroic mirrors.

Here, in the optical unit 1 of the exemplary embodiment, in any one of the first substrate 11, the second substrate 21, and the third substrate 31, the light shielding layer 80 is provided between the dichroic prism 50 and the peripheral region surrounding the display region, and the light shielding layer 80 absorbs the light of the first wavelength range, the light of the second wavelength range, and the light of the third wavelength range. Further, in the optical unit 1 of the exemplary embodiment, of the first substrate 11, the second substrate 21, and the third substrate 31, the light shielding layer 80 is also provided between the dichroic prism 50 and the peripheral region surrounding the display region in another of the substrates that is different from the one substrate described above. Furthermore, in the optical unit 1 of the exemplary embodiment, of the first substrate 11, the second substrate 21, and the third substrate 31, the light shielding layer 80 is also provided between the dichroic prism 50 and the peripheral region surrounding the display region in the remaining substrate that is different from the one substrate and the other substrate described above.

Specifically, in the exemplary embodiment, of the first substrate 11, the second substrate 21, and the third substrate 31, the light shielding layer 80 is provided between the dichroic prism 50 and each of the peripheral regions 112, 212, and 312 of all the substrates. Further, the light shielding layer 80 is provided between the dichroic prism 50 and metal wiring 16, 26, and 36, of the wiring 66, 67, 68, and 69 provided in the peripheral regions 112, 212, and 312 of the first substrate 11, the second substrate 21, and the third substrate 31, positioned closest to the side of the dichroic prism 50.

Thus, as illustrated in FIG. 11, in the dichroic prism 50, even when part of the color light that should be reflected has passed through the dichroic mirrors (the first dichroic mirror 56 and the second dichroic mirror 57), or when part of the color light that should be allowed to pass through is reflected by the dichroic mirrors (the first dichroic mirror 56 and the second dichroic mirror 57), this leaked light is blocked by the light shielding layer 80. Therefore, it is possible to suppress the leaked light from being reflected by the metal wiring 16, 26, and 36 and the like of the peripheral regions 112, 212, and 312 of the substrates (the first substrate 11, the second substrate 21, and the third substrate 31). As a result, the occurrence of stray light caused by the light reflected by the peripheral regions 112, 212, and 312 of the substrates (the first substrate 11, the second substrate 21, and the third substrate 31) can be suppressed.

For example, after part of the second image light LB emitted from the second panel 20 is not reflected by the second dichroic mirror 57 and passes through, even if the light passes through the first dichroic mirror 56 and advances obliquely toward the peripheral region 112 of the first panel 10, the leaked light is absorbed by the light shielding layer 80. Thus, it is possible to suppress the leaked light from being reflected by the metal wiring 16 formed in the peripheral region 112 of the first substrate 11 of the first panel 10, and becoming the stray light. Further, after part of the third image light LG emitted from the third panel 30 does not pass through the second dichroic mirror 57 and is reflected, even if the light advances obliquely toward the peripheral region 312 of the third panel 30, the leaked light is absorbed by the light shielding layer 80. Thus, it is possible to suppress the leaked light from being reflected by the metal wiring 36 formed in the peripheral region 312 of the third substrate 31 of the third panel 30, and becoming the stray light. As a result, in the display device to be described later, it is possible to suppress the leaked light from being visually recognized along with the image light.

Configuration Example of Light Shielding Layer 80

FIG. 10 is an explanatory diagram illustrating transmittance-wavelength characteristics of the light shielding layer 80 illustrated in FIG. 8 and the like. When configuring the light shielding layer 80 illustrated in FIG. 1, in the exemplary embodiment, the light shielding layer 80 is provided between the first substrate 11 and the cover substrate 18, between the second substrate 21 and the cover substrate 28, and between in the third substrate 31 and the cover substrate 38, in regions overlapping with the peripheral region 112, the peripheral region 212, and the peripheral region 312. For example, the light shielding layer 80 is provided on each of the peripheral region 112 of the first substrate 11, the peripheral region 212 of the second substrate 21, and the peripheral region 312 of the third substrate 31. Here, the light shielding layer 80 can be configured by a black filter layer containing black particles, such as carbon particles or the like, a light-absorbent metal layer, a light-absorbent metal compound layer or the like.

Further, the light shielding layer 80 may be configured by providing the first coloring layer 81(R), the second coloring layer 81(B), and the third coloring layer 81(G) explained with reference to FIG. 8, FIG. 9, and FIG. 10 so as to overlap with each other.

More specifically, as illustrated in FIG. 8, when providing the light shielding layer 80 on the peripheral region 112 of the first substrate 11, a first color filter layer 82(R) that is formed of the same material as the first coloring layer 81(R), a second color filter layer 82(B) that is formed of the same material as the second coloring layer 81(B) illustrated in FIG. 9, and a third color filter layer 82(G) that is formed of the same material as the third coloring layer 81(G) illustrated in FIG. 10 are laminated on the peripheral region 112.

Here, the transmittance-wavelength characteristics of the first coloring layer 81(R) and the first color filter layer 82(R) have the transmittance-wavelength characteristics indicated by the dashed line P81(R) illustrated in FIG. 2. The second coloring layer 81(B) and the second color filter layer 82(B) have the transmittance-wavelength characteristics indicated by the one-dot chain line P81(B) in FIG. 2. The third coloring layer 81(G) and the third color filter layer 82(G) have the transmittance-wavelength characteristics indicated by the two-dot chain line P81(G) in FIG. 2. Thus, by laminating the first color filter layer 82(R), the second color filter layer 82(B), and the third color filter layer 82(G), the light shielding layer 80 can be obtained having the transmittance-wavelength characteristics indicated by a solid line P80 in FIG. 2. As a result, the light shielding layer 80, the light of the first wavelength range, the light of the second wavelength range, and the light of the third wavelength range can be appropriately absorbed.

Here, while the first color filter layer 82(R) is formed continuously from the first coloring layer 81(R) of the first display region 111 to the peripheral region 112, the second color filter layer 82(B) and the third color filter layer 82(G) are formed only in the peripheral region 112, and are not formed in the first display region 111. In the exemplary embodiment, the second color filter layer 82(B) and the third color filter layer 82(G) are formed between the first substrate 11 and the first color filter layer 82(R). Thus, the second color filter layer 82(B) and the third color filter layer 82(G) are sequentially formed in a predetermined pattern, and after that, the first color filter layer 82(R) is formed. As a result, after forming the first color filter layer 82(R), it is not necessary to perform a process for the patterning of the second color filter layer 82(B) and the third color filter layer 82(G), and thus, a situation does not occur in which the first color filter layer 82(R) is damaged by the patterning.

Further, as illustrated in FIG. 9, when providing the light shielding layer 80 on the peripheral region 212 of the second substrate 21, similarly to the peripheral region 112 of the first substrate 11, the first color filter layer 82(R) that is formed of the same material as the first coloring layer 81(R), the second color filter layer 82(B) that is formed of the same material as the second coloring layer 81(B), and the third color filter layer 82(G) that is formed of the same material as the third coloring layer 81(G) are laminated on the peripheral region 212.

Here, while the second color filter layer 82(B) is formed continuously from the second coloring layer 81(B) of the second display region 211 to the peripheral region 212, the first color filter layer 82(R) and the third color filter layer 82(G) are formed only in the peripheral region 212, and are not formed in the second display region 211. In the exemplary embodiment, the first color filter layer 82(R) and the third color filter layer 82(G) are formed between the second substrate 21 and the second color filter layer 82(B). As a result, after forming the second color filter layer 82(B), it is not necessary to perform a process for the patterning of the first color filter layer 82(R) and the third color filter layer 82(G), and thus, a situation does not occur in which the second color filter layer 82(B) is damaged by the patterning.

Also, as illustrated in FIG. 10, when providing the light shielding layer 80 on the peripheral region 312 of the third substrate 31, similarly to the light shielding layer 80 on the peripheral region 112 of the first substrate 11, the first color filter layer 82(R) that is formed of the same material as the first coloring layer 81(R), the second color filter layer 82(B) that is formed of the same material as the second coloring layer 81(B), and the third color filter layer 82(G) that is formed of the same material as the third coloring layer 81(G) are laminated on the peripheral region 312.

Here, while the third color filter layer 82(G) is formed continuously from the third coloring layer 81(G) of the third display region 311 to the peripheral region 312, the first color filter layer 82(R) and the second color filter layer 82(B) are formed only in the peripheral region 312, and are not formed in the third display region 311. In the exemplary embodiment, the first color filter layer 82(R) and the second color filter layer 82(B) are formed between the third substrate 31 and the third color filter layer 82(G). As a result, after forming the third color filter layer 82(G), it is not necessary to perform a process for the patterning of the first color filter layer 82(R) and the second color filter layer 82(B), and thus, a situation does not occur in which the third color filter layer 82(G) is damaged by the patterning.

Second Exemplary Embodiment

Figure 12:
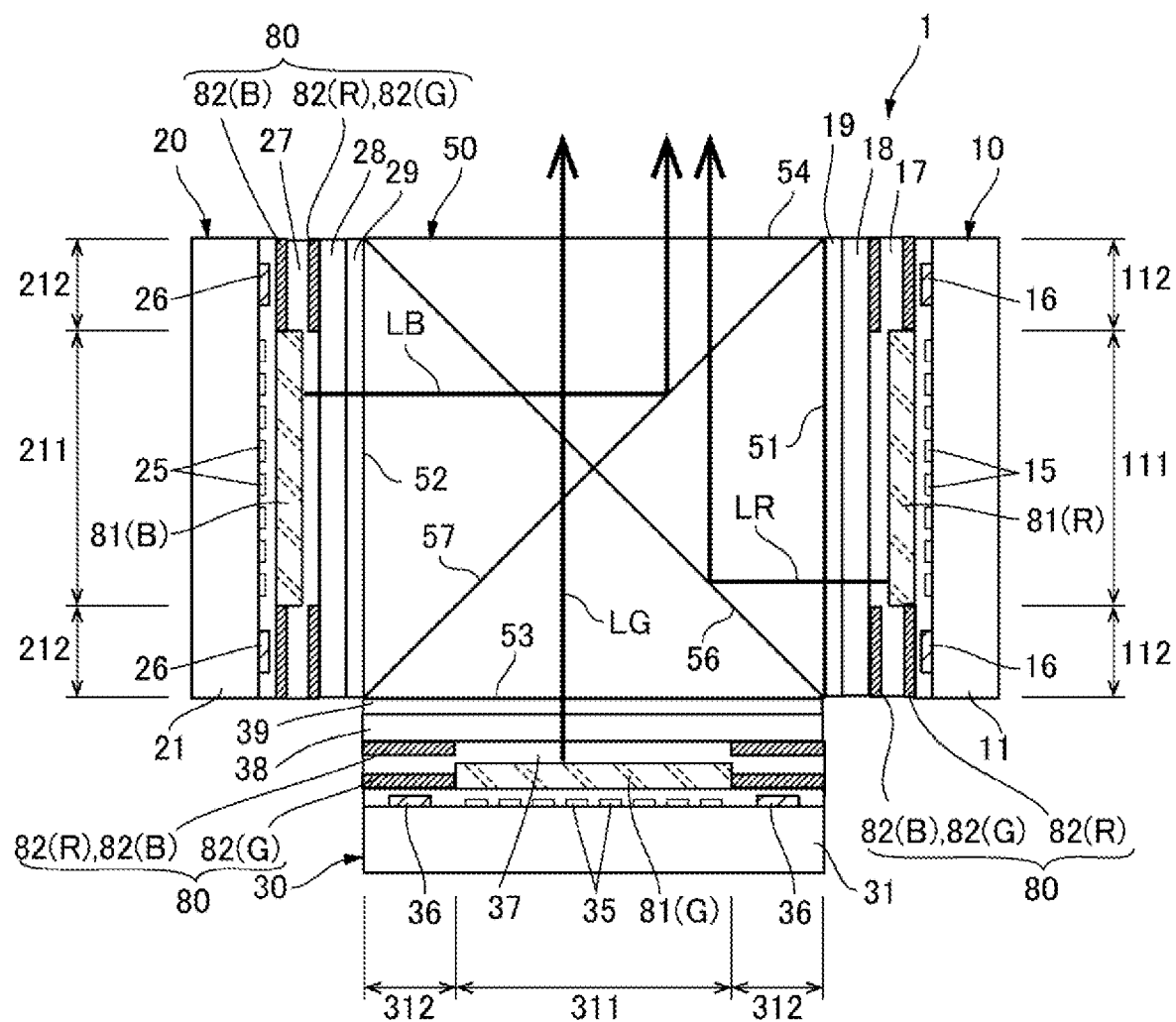
FIG. 12 is a plan view of the optical unit according to a second exemplary embodiment of the invention.
Figure 13:
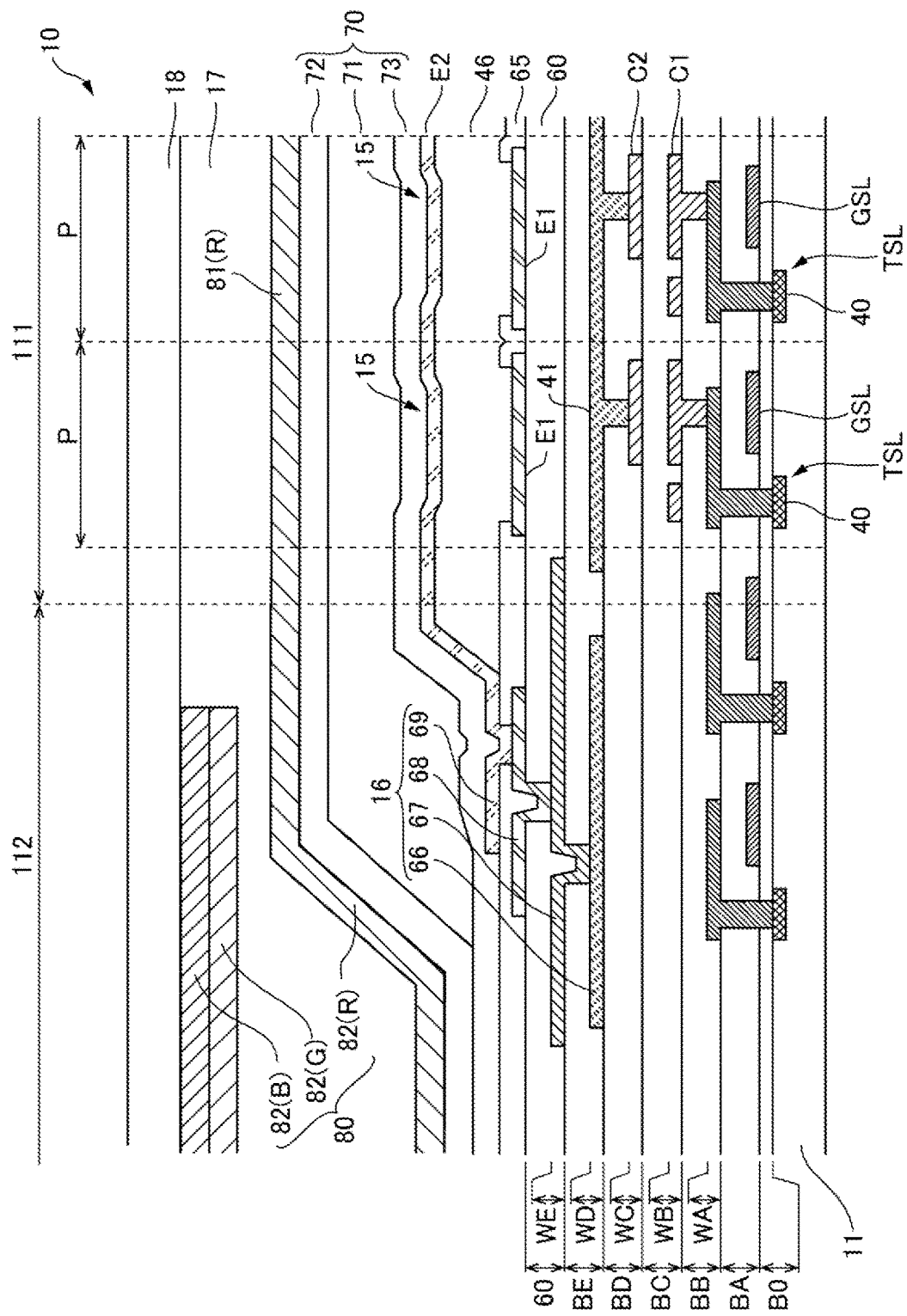
FIG. 13 is an explanatory diagram of the light shielding layer provided between the first panel and the dichroic mirror illustrated in FIG. 12.

FIG. 12 is a plan view of the optical unit 1 according to a second exemplary embodiment of the invention. FIG. 13 is an explanatory diagram of the light shielding layer 80 provided between the first panel 10 and the dichroic prism 50 illustrated in FIG. 12. Note that basic configurations in this exemplary embodiment are the same as in the first exemplary embodiment, and thus, common portions are denoted by the same reference signs and the description of the common portions will be omitted.

In the first exemplary embodiment, the light shielding layer 80 is provided on each of the peripheral regions 112, 212, and 312 of the first substrate 11, the second substrate 21, and the third substrate 31 by laminating the first color filter layer 82(R), the second color filter layer 82(B), and the third color filter layer 82(G).

In contrast to this, in this exemplary embodiment, as illustrated in FIG. 12 and FIG. 13, of the first color filter layer 82(R), the second color filter layer 82(B), and the third color filter layer 82(G), only the first color filter layer 82(R) is provided in the peripheral region 112 of the first substrate 11. However, on the cover substrate 18, the second color filter layer 82(B) and the third color filter layer 82(G) are laminated in a region facing the peripheral region 112. Thus, the light shielding layer 80 can be configured by the first color filter layer 82(R), the second color filter layer 82(B), and the third color filter layer 82(G).

Further, although not illustrated in detail, using the same configuration, the light shielding layer 80 is provided between the dichroic prism 50 and each of the peripheral regions 212 and 312 of the second substrate 21 and the third substrate 31. Specifically, as illustrated in FIG. 12, while the second color filter layer 82(B) is provided in the peripheral region 212 of the second substrate 21, on the cover substrate 28, the first color filter layer 82(R) and the third color filter layer 82(G) are laminated in a region facing the peripheral region 212. Further, as illustrated in FIG. 12, while the third color filter layer 82(G) is provided in the peripheral region 312 of the third substrate 31, on the cover substrate 38, the first color filter layer 82(R) and the second color filter layer 82(B) are laminated in a region facing the peripheral region 312.

Modified Example of Second Exemplary Embodiment

In the above-described second exemplary embodiment, the second color filter layer 82(B) and the third color filter layer 82(G) are provided on a surface of the cover substrate 18 on the first substrate 11 side, but the second color filter layer 82(B) and the third color filter layer 82(G) may be provided on the surface of the cover substrate 18 on the opposite side to the first substrate 11 (the surface on the side of the first incident surface 51 of the dichroic prism 50), or on the first incident surface 51 of the dichroic prism 50.

Further, in the above-described second exemplary embodiment, the first color filter layer 82(R) and the third color filter layer 82(G) are provided on a surface of the cover substrate 28 on the second substrate 21 side, but the first color filter layer 82(R) and the third color filter layer 82(G) may be provided on the surface of the cover substrate 28 on the opposite side to the second substrate 21 (the surface on the side of the second incident surface 52 of the dichroic prism 50), or on the second incident surface 52 of the dichroic prism 50.

Further, in the above-described second exemplary embodiment, the first color filter layer 82(R) and the second color filter layer 82(B) are provided on a surface of the cover substrate 38 on the third substrate 31 side, but the first color filter layer 82(R) and the second color filter layer 82(B) may be provided on the surface of the cover substrate 38 on the opposite side to the third substrate 31 (the surface on the side of the third incident surface 53 of the dichroic prism 50), or on the third incident surface 53 of the dichroic prism 50.

Third Exemplary Embodiment

Figure 14:
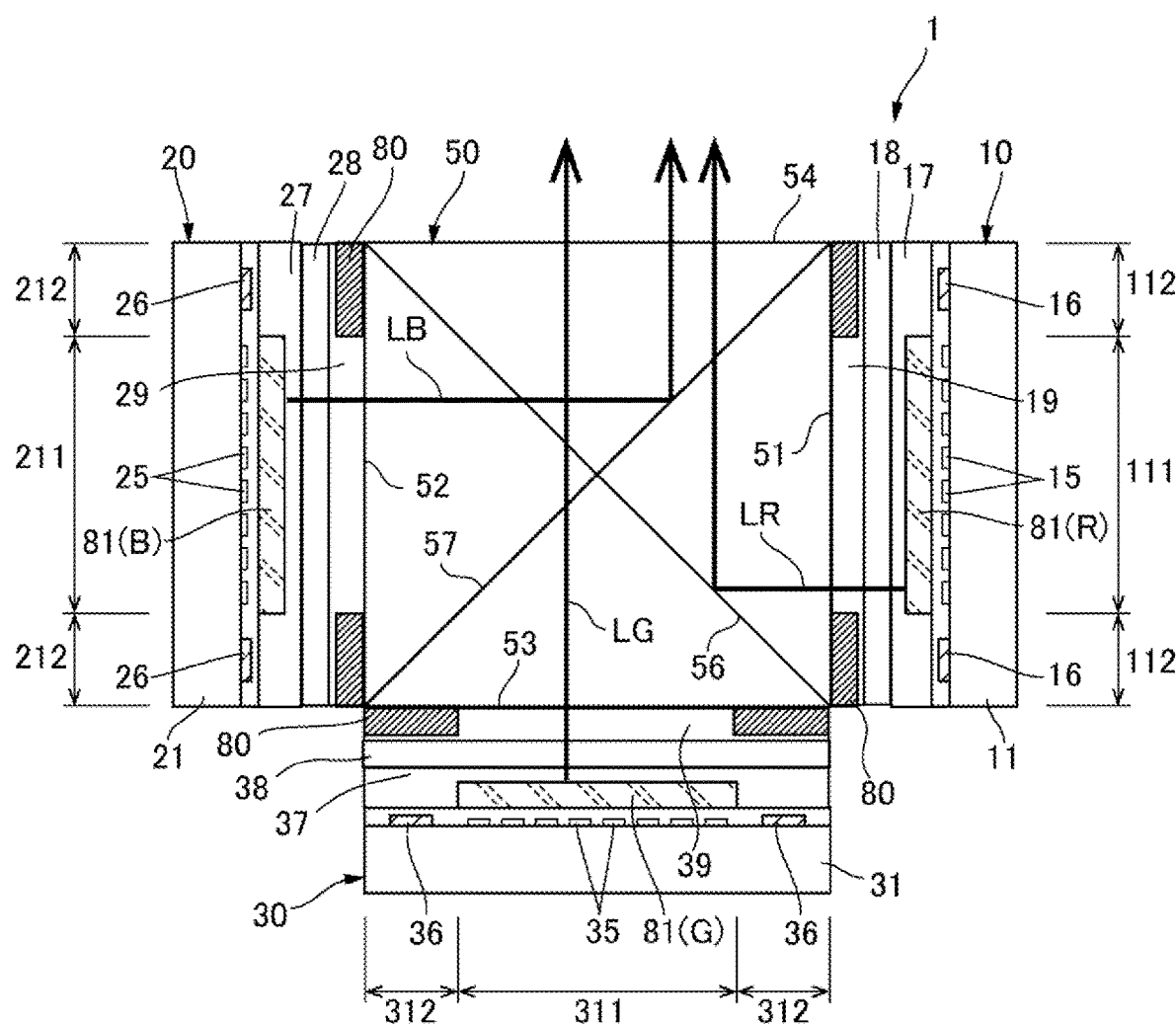
FIG. 14 is a plan view of the optical unit according to a third exemplary embodiment of the invention.

FIG. 14 is a plan view of the optical unit 1 according to a third exemplary embodiment of the invention. Note that basic configurations in this exemplary embodiment are the same as in the first exemplary embodiment, and thus, common portions are denoted by the same reference signs and the description of the common portions will be omitted.

As illustrated in FIG. 14, also in the optical unit 1 of this exemplary embodiment, similar to the first exemplary embodiment, the light shielding layer 80 is provided between the dichroic prism 50 and each of the peripheral regions 112, 212, and 312 of the first substrate 11, the second substrate 12, and the third substrate 31. When providing the light shielding layer 80, in this exemplary embodiment, the light shielding layer 80 is provided between the cover substrate 18 and the dichroic prism 50, between the cover substrate 28 and the dichroic prism 50, and between the cover substrate 38 and the dichroic prism 50, in regions overlapping with the peripheral region 112, the peripheral region 212, and the peripheral region 312. For example, the light shielding layer 80 is provided on the first incident surface 51, the second incident surface 52, and the third incident surface 53 of the dichroic prism 50, in regions facing the peripheral regions 112, 212, and 312 of the first substrate 11, the second substrate 21, and the third substrate 31.

In this case, the light shielding layer 80 may be configured by the laminated layer of the first color filter layer 82(R), the second color filter layer 82(B), and the third color filter layer 82(G), a black filter layer containing black particles, such as carbon particles or the like, a light-absorbent metal layer, a light-absorbent metal compound layer or the like.

Modified Example of Third Exemplary Embodiment

In the above-described third exemplary embodiment, the light shielding layer 80 is provided on the first incident surface 51, the second incident surface 52, and the third incident surface 53 of the dichroic prism 50, but the light shielding layer 80 may be provided on the surfaces of the cover substrates 18, 28 and 38 on the dichroic prism 50 side.

Forming Range of Light Shielding Layer 80

Figure 15:
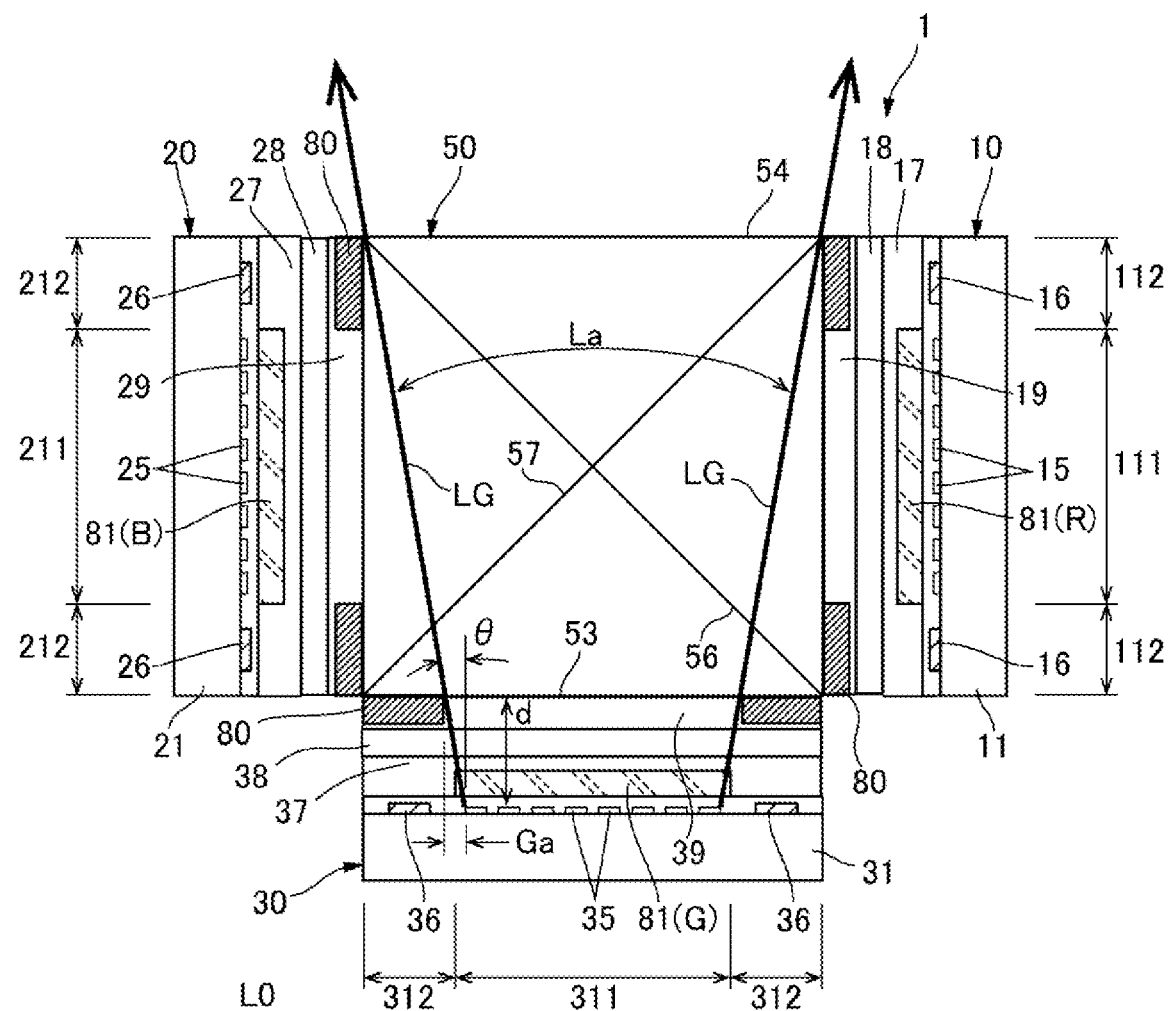
FIG. 15 is an explanatory diagram illustrating a first example of a forming range of the light shielding layer in the optical unit to which the invention is applied.
Figure 16:
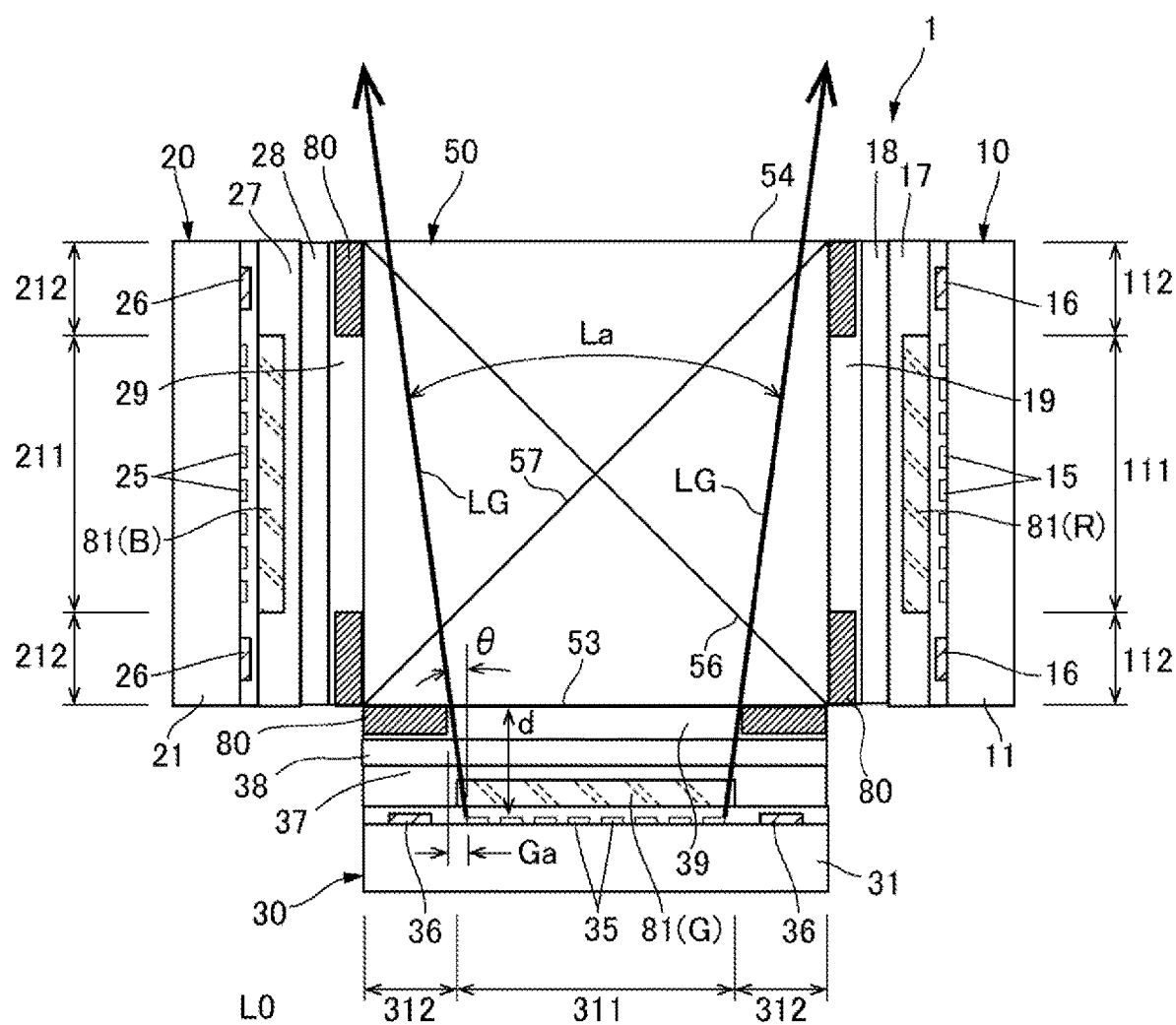
FIG. 16 is an explanatory diagram illustrating a second example of the forming range of the light shielding layer in the optical unit to which the invention is applied.

FIG. 15 is an explanatory diagram illustrating a first example of a forming range of the light shielding layer 80 in the optical unit 1 to which the invention is applied. FIG. 16 is an explanatory diagram illustrating a second example of the forming range of the light shielding layer 80 in the optical unit 1 to which the invention is applied. As in the second exemplary embodiment or the third exemplary embodiment, when the light shielding layer 80 is provided in a position separated from the panel to the side of the dichroic prism 50, when a part of the image light emitted from the panel is blocked by the light shielding layer 80, a decrease in an amount of light, or image loss occurs.

Thus, as illustrated in FIG. 15, and as explained taking the third image light LG emitted from the third panel 30 as an example, of a luminous flux of the third image light LG emitted toward the dichroic prism 50 from the third display region 311 of the third substrate 31, the light shielding layer 80 is preferably provided in a position separated from an effective luminous flux LO corresponding to a luminous flux emitted from the emission surface 54.

For example, when an angle between a ray of light positioned at the end of the effective luminous flux LO and a normal line with respect to the third incident surface 53 is θ, a distance in the direction of the normal line with respect to the third incident surface 53 from the third light-emitting element 35 to the surface of the light shielding layer 80 on the dichroic prism 50 side is d, and an interval between an edge of the light shielding layer 80, when seen from the direction of the normal line with respect to the third incident surface 53, and the third light-emitting element 35 positioned on an end portion of the third display region 311 is Ga, the angle θ, the distance d, and the interval Ga preferably satisfy the following condition.

$$Ga > d*\tan\theta$$

Further, as illustrated in FIG. 16, when a part of the luminous flux emitted from the emission surface 54 is the effective luminous flux LO that is used in the display of the image, the light shielding layer 80 is preferably provided in a position separated from the effective luminous flux LO. In this case also, the angle θ between the ray of light positioned at the end of the effective luminous flux LO and the normal line with respect to the third incident surface 53, the distance d in the direction of the normal line with respect to the third incident surface 53 from the third light-emitting element 35 to the surface of the light shielding layer 80 on the dichroic prism 50 side, and the interval Ga between the edge of the light shielding layer 80, when seen from the direction of the normal line with respect to the third incident surface 53, and the third light-emitting element 35 positioned on the end portion of the third display region 311 preferably satisfy the following condition.

$$Ga > d*\tan\theta$$

OTHER EXEMPLARY EMBODIMENTS

In the above-described exemplary embodiments, in the first panel 10, the second panel 20, and the third panel 30, the white light emitted from the light-emitting elements is caused to be the image light of each wavelength range as a result of the coloring layers, but since the optical resonator is provided in the first panel 10, the second panel 20, and the third panel 30, the invention may also be applied to a case in which the layers are not provided. Further, the invention may be applied to a case in which, in the first panel 10, the second panel 20, and the third panel 30, the light-emitting elements themselves emit the image light of each of the wavelength ranges. Further, when, in the first panel 10, the second panel 20, and the third panel 30, the light-emitting elements themselves emit the image light of each of the wavelength ranges, although there are cases in which one of the coloring layers or the optical resonator, or both the coloring layers and the optical resonator are not provided, the invention may also be applied to this type of case. In the above-described exemplary embodiments, the cover substrates 18, 28, and 38 are provided on the first panel 10, the second panel 20, and the third panel 30, but the invention may be applied to a case in which the cover substrates are not provided.

In the above-described exemplary embodiments, the light shielding layer 80 is provided on all of the first panel 10, the second panel 20, and the third panel 30, but the light shielding layer 80 may be provided on one or some of the first panel 10, the second panel 20, and the third panel 30.

In all of the above-described exemplary embodiments, a case is exemplified in which each of the plurality of pixels has the organic electroluminescent element as the light-emitting element, but the invention may be applied to a case in which a light-emitting diode or the like is provided as the light-emitting element.

Configuration Example 1 of Display Device

Figure 17:
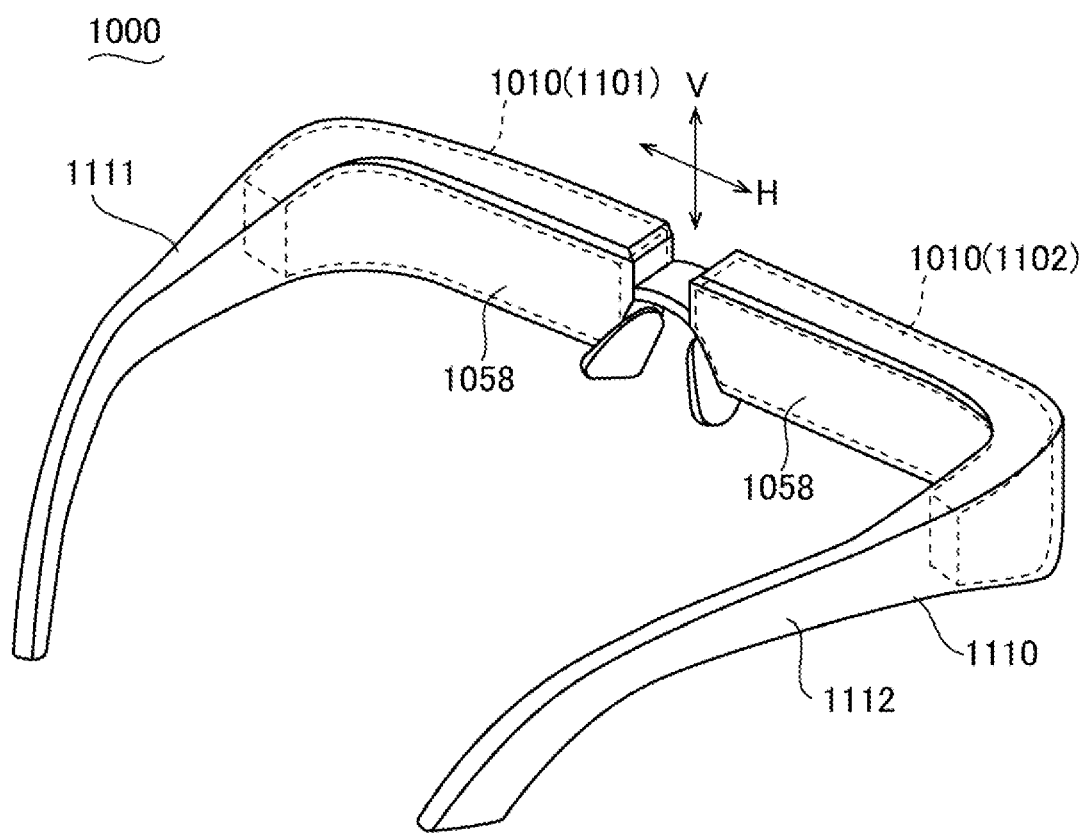
FIG. 17 is an explanatory diagram of a head-mounted display device.
Figure 18:
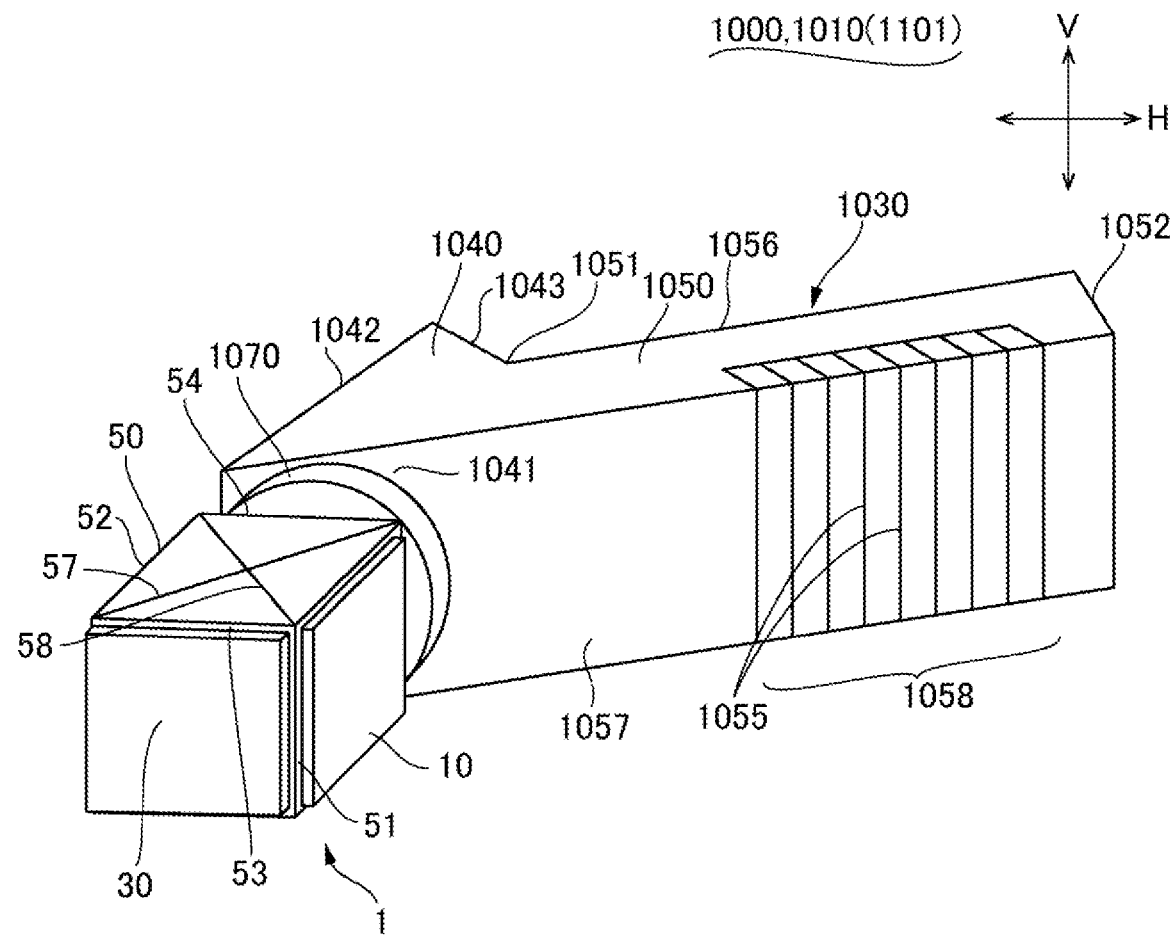
FIG. 18 is a perspective view schematically illustrating a configuration of an optical system of a display unit illustrated in FIG. 17.
Figure 19:
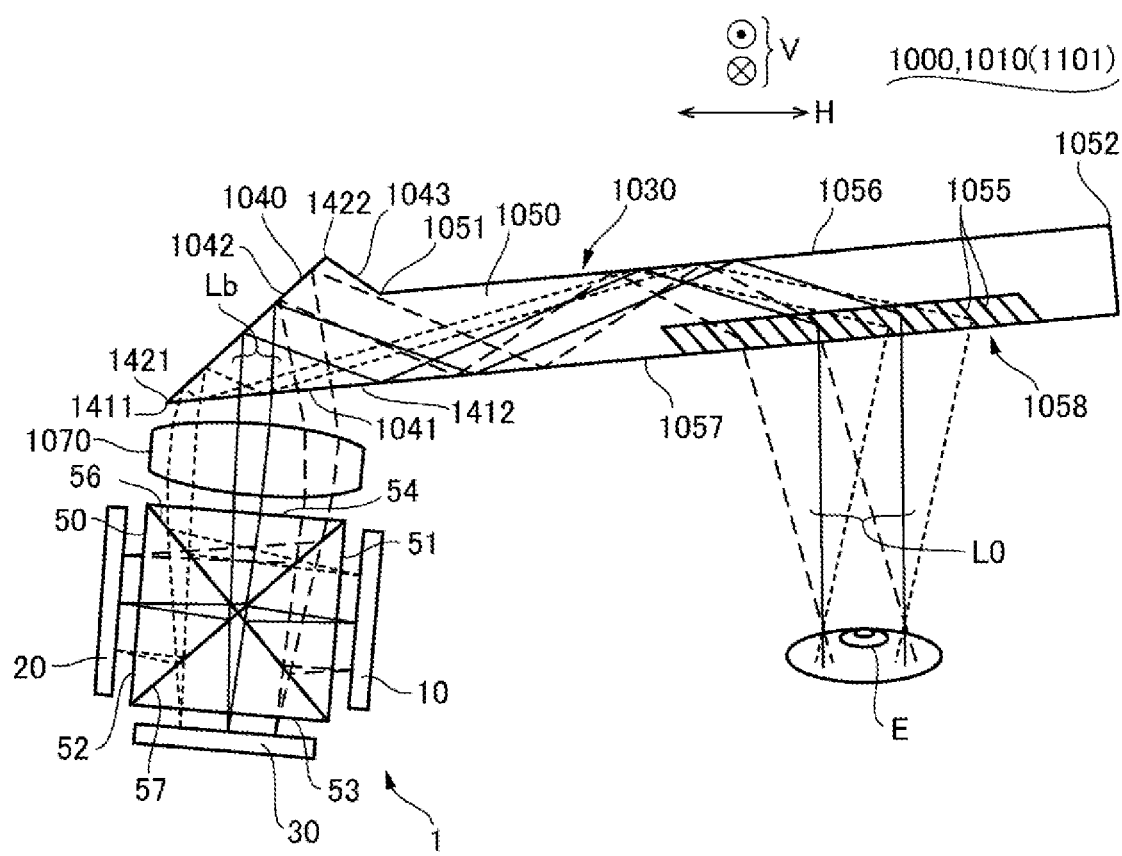
FIG. 19 is an explanatory diagram illustrating optical paths of the optical system illustrated in FIG. 18.

The optical unit 1 described in the above-described exemplary embodiments is used in a display device or the like described below. FIG. 17 is an explanatory diagram of a head-mounted display device 1000. FIG. 18 is a perspective view schematically illustrating a configuration of an optical system of virtual display units 1010 illustrated in FIG. 17. FIG. 19 is an explanatory diagram illustrating optical paths of the optical system illustrated in FIG. 18.

A display device 1000 illustrated in FIG. 17 is configured as a see-through eyeglass display, and includes a frame 1110 provided with left and right temples 1111 and 1112. In the display device 1000, the virtual display units 1010 are supported by the frame 1110, and an image emitted from the virtual display units 1010 is caused to be recognized as a virtual image by a user. In this exemplary embodiment, the display device 1000 is provided with a left-eye display unit 1101 and a right-eye display unit 1102 as the virtual display units 1010. The left-eye display unit 1101 and the right-eye display unit 1102 are disposed left-right symmetrically with the identical configuration.

Therefore, the left-eye display unit 1101 will be mainly described below, and the description of the right-eye display unit 1102 will be omitted. As illustrated in FIG. 18, in the display device 1000, the display unit 1101 includes the optical unit 1, and a light guide system 1030 that guides synthesized light Lb emitted from the optical unit 1 to an emission unit 1058. A projection lens system 1070 is disposed between the optical unit 1 and the light guide system 1030, and the synthesized light Lb emitted from the optical unit 1 enters the light guide system 1030 via the projection lens system 1070. The projection lens system 1070 is configured by a single collimate lens that has a positive power.

The light guide system 1030 is configured by a transmissive incident unit 1040 on which the synthesized light Lb is incident, and a transmissive light guide unit 1050, a one end 1051 side of which is connected to the incident unit 1040. In the embodiment, the incident unit 1040 and the light guide unit 1050 are configured as an integrated transmissive member.

The incident unit 1040 is provided with an incident surface 1041 on which the synthesized light Lb emitted from the optical unit 1 is incident, and a reflection surface 1042 that reflects the synthesized light Lb that has entered from the incident surface 1041 between the reflection surface 1042 and the incident surface 1041. The incident surface 1041 is a flat surface, an aspherical surface, a free form surface, or the like, and faces the optical unit 1 via the projection lens system 1070. The projection lens system 1070 is disposed obliquely such that an interval between the projection lens system 1070 and an end portion 1412 of the incident surface 1041 is larger than an interval between the projection lens system 1070 and an end portion 1411 of the incident surface 1041. A reflection film or the like is not formed on the incident surface 1041, but the incident surface 1041 fully reflects light that is incident at an incident angle equal to or greater than a critical angle. Thus, the incident surface 1041 has transmittance and reflectivity. The reflection surface 1042 is a surface facing the incident surface 1041 and is disposed obliquely such that an end portion 1422 of the reflection surface 1042 is separated farther from the incident surface 1041 than from an end portion 1421 of the incident surface 1041. Thus, the incident unit 1040 has a substantially triangular shape. The incident surface 1042 is a flat surface, an aspherical surface, a free form surface, or the like. The reflection surface 1042 can adopt a configuration in which a reflective metal layer mainly formed of aluminum, silver, magnesium, chrome or the like is formed.

The light guide unit 1050 is provided with a first surface 1056 (a first reflection surface) that extends from a one end 1051 to another end 1052 side, a second surface 1057 (a second reflection surface) that extends in parallel to the first surface 1056 from the one end 1051 side to the other end 1052 side, and an emission portion 1058 provided on a section of the second surface 1057 that is separated from the incident unit 1040. The first surface 1056 and the reflection surface 1042 of the incident unit 1040 are joined together by an inclined surface 1043. A thickness of the first surface 1056 and the second surface 1057 is thinner than the incident unit 1040. The first surface 1056 and the second surface 1057 reflect all of the light that is incident at an incident angle equal to or greater than the critical angle, on the basis of a refractive index difference between the light guide unit 1050 and the outside (the air). Thus, a reflection film and the like is not formed on the first surface 1056 and the second surface 1057.

The emission unit 1058 is configured on a part of the light guide unit 1050 on the side of the second surface 1057 in the thickness direction of the light guide unit 1050. In the emission unit 1058, a plurality of partial reflection surfaces 1055 that are inclined obliquely with respect to a normal line with respect to the second surface 1057 are arranged so as to be mutually parallel to each other. The emission unit 1058 is a portion that overlaps with the plurality of partial reflection surfaces 1055, of the second surface 1057, and is a region having a predetermined width in an extending direction of the light guide unit 1050. Each of the plurality of partial reflection surfaces 1055 is formed by a dielectric multilayer film. Further, at least one of the plurality of partial reflection surfaces 1055 may be a composite layer of a dielectric multilayer film with a reflective metal layer (thin film) mainly formed of aluminum, silver, magnesium, chrome, or the like. When the partial reflection surface 1055 is configured to include the metal layer, an effect can be obtained to improve the reflectance of the partial reflection surface 1055, or an effect that the incident angle dependence or the polarization dependence of the transmittance and the reflectance of the partial reflection surface 1055 can be optimized. Note that the emission unit 1058 may have a configuration in which an optical element, such as a diffraction grating, a hologram, or the like is provided.

In the display device 1000 configured in this manner, the synthesized light Lb formed of the parallel light incident from the incident unit 1040, is refracted by the incident surface 1041 and is oriented toward the reflection surface 1042. Next, the synthesized light Lb is reflected by the reflection surface 1042, and is once again oriented toward the incident surface 1041. At this time, since the synthesized light Lb is incident on the incident surface 1041 at the incident angle equal to or greater than the critical angle, the synthesized light Lb is reflected by the incident surface 1041 toward the light guide unit 1050, and is oriented toward the light guide unit 1050. Note that, in the incident unit 1040, the configuration is used in which the synthesized light Lb that is the parallel light is incident on the incident surface 1041, but a configuration may be adopted in which the incident surface 1041 and the reflection surface 1042 are configured by a free form curve or the like, and after the synthesized light Lb that is formed of the non-parallel light is incident on the incident surface 1041, the synthesized light Lb is reflected between the reflection surface 1042 and the incident surface 1041 and is converted to the parallel light while being reflected.

In the light guide unit 1050, the synthesized light Lb is reflected between the first surface 1056 and the second surface 1057, and advances. Then, a part of the synthesized light Lb that is incident on the partial reflection surface 1055 is reflected by the partial reflection surface 1055 and is emitted from the emission unit 1058 toward an eye E of an observer. Further, the rest of the synthesized light Lb incident on the partial reflection surface 1055 passes through the partial reflection surface 1055 and is incident to the next, adjacent, partial reflection surface 1055. As a result, the synthesized light Lb that is reflected by each of the plurality of partial reflection surfaces 1055 is emitted from the emission unit 1058 toward the eye E of the observer. Therefore, the observer can recognize a virtual image. At this time, of the light from the outside, the light that has entered the light guide unit 1050 from the outside passes through the partial reflection surfaces 1055 after entering the light guide unit 1050, and reaches the eye E of the observer. As a result, the observer can see the color image emitted from the optical unit 1 and can also see the outside background and the like in a see through manner.

Configuration Example 2 of Display Device

Figure 20:
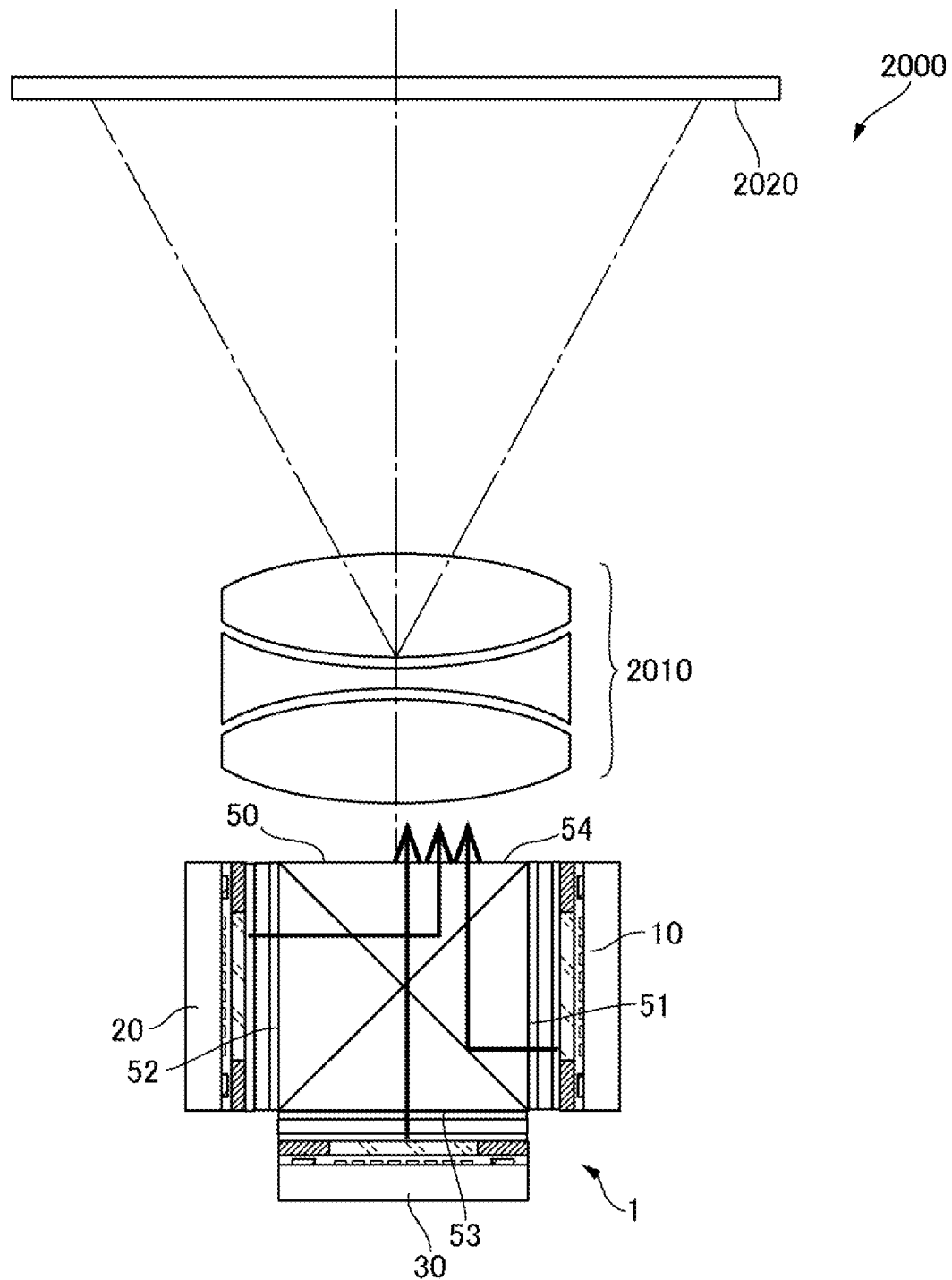
FIG. 20 is an explanatory diagram of a projection-type display device.

FIG. 20 is an explanatory diagram of a projection-type display device 2000. The display device 2000 illustrated in FIG. 20 includes the optical unit 1 according to the above-described exemplary embodiments, and a projection optical system 2100 that expands and projects the synthesized light Lb emitted from the optical unit 1 onto a projection receiving member 2200, such as a screen or the like.

Other Configuration Examples of Display Device

The display device (electronic apparatus) provided with the optical unit 1 described in the above-described exemplary embodiments can be an electronic view finder (EVF) or the like used in an imaging device, such as a video camera and a still camera.

The entire disclosure of Japanese Patent Application No. 2018-059468, filed Mar. 27, 2018 is expressly incorporated by reference herein.

What is claimed is:

1. An optical unit comprising:
  a first panel including:
    a first light-emitting element disposed in a first display region; and
    a first light-shielding member disposed in a first peripheral region outside the first display region;
  a second panel including:
    a second light-emitting element disposed in a second display region; and
    a second light-shielding member disposed in a second peripheral region outside the second display region; and a prism synthesizing a first image light which emitted from the first panel and a second image light which emitted from the second panel.

2. The optical unit according to claim 1, wherein
the first light-shielding member and the second light-shielding member absorb light in a first wavelength range emitted from the first light-emitting element and light in a second wavelength range emitted from the second light-emitting element.

3. The optical unit according to claim 2, wherein
the first panel includes a first colored layer disposed in the first display region,
the second panel includes a second colored layer disposed in the second display region,
the first light-shielding member is configured by a same material as the first colored layer and a same material as the second colored layer, and
the second light-shielding member is configured by a same material as the first colored layer and a same material as the second colored layer.

4. The optical unit according to claim 3, wherein
the first panel includes a first wiring layer disposed in the first peripheral region,
the second panel includes a second wiring layer disposed in the second peripheral region,
the first light-shielding member is provided between the first wiring layer and the prism, and
the second light-shielding member is provided between the second wiring layer and the prism.

5. The optical unit according to claim 2, wherein
the first light-shielding member and the second light-shielding member are configured by a black filter layer including black particles, a light-absorbent metal layer, or a light-absorbent metal compound layer.

6. The optical unit according to claim 5, wherein
the first panel includes a first wiring layer disposed in the first peripheral region,
the second panel includes a second wiring layer disposed in the second peripheral region,
the first light-shielding member is provided between the first wiring layer and the prism, and
the second light-shielding member is provided between the second wiring layer and the prism.

7. The optical unit according to claim 2, wherein
the first panel includes a first wiring layer disposed in the first peripheral region,
the second panel includes a second wiring layer disposed in the second peripheral region,
the first light-shielding member is provided between the first wiring layer and the prism, and
the second light-shielding member is provided between the second wiring layer and the prism.

8. The optical unit according to claim 1, wherein
the first panel includes a first colored layer disposed in the first display region,
the second panel includes a second colored layer disposed in the second display region,
the first light-shielding member is configured by a same material as the first colored layer and a same material as the second colored layer, and
the second light-shielding member is configured by a same material as the first colored layer and a same material as the second colored layer.

9. The optical unit according to claim 1, wherein
the first light-shielding member and the second light-shielding member are configured by a black filter layer including black particles, a light-absorbent metal layer, or a light-absorbent metal compound layer.

10. The optical unit according to claim 1, wherein
the first panel includes a first wiring layer disposed in the first peripheral region,
the second panel includes a second wiring layer disposed in the second peripheral region,
the first light-shielding member is provided between the first wiring layer and the prism, and
the second light-shielding member is provided between the second wiring layer and the prism.

11. An optical unit comprising:
a first panel including:
  a first light-emitting element disposed in a first display region; and
  a first light-shielding member disposed in a first peripheral region outside the first display region;
a second panel including:
  a second light-emitting element disposed in a second display region; and
  a second light-shielding member disposed in a second peripheral region outside the second display region;
a third panel including:
  a third light-emitting element disposed in a third displayer region; and
  a third light-shielding member disposed in a third peripheral region outside the third display region; and
a prism synthesizing a first image light which emitted from the first panel, a second image light which emitted from the second panel, and a third image light which emitted from the third panel.

12. The optical unit according to claim 11, wherein
the first light-shielding member, the second light-shielding member, and the third light-shielding member absorb light in a first wavelength range emitted from the first light-emitting element, light in a second wavelength range emitted from the second light-emitting element, and light in a third wavelength range emitted from the third light-emitting element.

13. The optical unit according to claim 12, wherein
the first panel includes a first colored layer disposed in the first display region,
the second panel includes a second colored layer disposed in the second display region,
the third panel includes a third colored layer disposed in the third display region,
the first light-shielding member is configured by a same material as the first colored layer, a same material as the second colored layer, and a same material as the third colored layer,
the second light-shielding member is configured by the same material as the first colored layer, the same material as the second colored layer, and the same material as the third colored layer, and
the third light-shielding member is configured by the same material as the first colored layer, the same material as the second colored layer, and the same material as the third colored layer.

14. The optical unit according to claim 13, wherein
the first panel includes a first wiring layer disposed in the first peripheral region,
the second panel includes a second wiring layer disposed in the second peripheral region,
the third panel includes a third wiring layer disposed in the third peripheral region, the first light-shielding member is provided between the
first wiring layer and the prism,
the second light-shielding member is provided between
the second wiring layer and the prism, and
the third light-shielding member is provided between the
third wiring layer and the prism.

15. The optical unit according to claim 12, wherein
the first light-shielding member, the second light-shielding member, and the third light-shielding member are configured by a black filter layer including black particles, a light-absorbent metal layer, or a light-absorbent metal compound layer.

16. The optical unit according to claim 15, wherein
the first panel includes a first wiring layer disposed in the first peripheral region,
the second panel includes a second wiring layer disposed in the second peripheral region,
the third panel includes a third wiring layer disposed in the third peripheral region,
the first light-shielding member is provided between the first wiring layer and the prism,
the second light-shielding member is provided between the second wiring layer and the prism, and
the third light-shielding member is provided between the third wiring layer and the prism.

17. The optical unit according to claim 12, wherein
the first panel includes a first wiring layer disposed in the first peripheral region,
the second panel includes a second wiring layer disposed in the second peripheral region,
the third panel includes a third wiring layer disposed in the third peripheral region,
the first light-shielding member is provided between the first wiring layer and the prism,
the second light-shielding member is provided between the second wiring layer and the prism, and
the third light-shielding member is provided between the third wiring layer and the prism.

18. The optical unit according to claim 11, wherein
the first panel includes a first colored layer disposed in the first display region,
the second panel includes a second colored layer disposed in the second display region,
the third panel includes a third colored layer disposed in the third display region,
the first light-shielding member is configured by a same material as the first colored layer, a same material as the second colored layer, and a same material as the third colored layer,
the second light-shielding member is configured by the same material as the first colored layer, the same material as the second colored layer, and the same material as the third colored layer, and
the third light-shielding member is configured by the same material as the first colored layer, the same material as the second colored layer, and the same material as the third colored layer.

19. The optical unit according to claim 11, wherein
the first light-shielding member, the second light-shielding member, and the third light-shielding member are configured by a black filter layer including black particles, a light-absorbent metal layer, or a light-absorbent metal compound layer.

20. The optical unit according to claim 11, wherein
the first panel includes a first wiring layer disposed in the first peripheral region,
the second panel includes a second wiring layer disposed in the second peripheral region,
the third panel includes a third wiring layer disposed in the third peripheral region,
the first light-shielding member is provided between the first wiring layer and the prism,
the second light-shielding member is provided between the second wiring layer and the prism, and
the third light-shielding member is provided between the third wiring layer and the prism.

* * * * *